United States Patent
Moriya et al.

(10) Patent No.: US 7,799,407 B2
(45) Date of Patent: Sep. 21, 2010

(54) BANK STRUCTURE, WIRING PATTERN FORMING METHOD, DEVICE, ELECTRO-OPTICAL DEVICE, AND ELECTRONIC APPARATUS

(75) Inventors: Katsuyuki Moriya, Azumino (JP); Toshimitsu Hirai, Chino (JP)

(73) Assignee: Seiko Epson Corporation (JP)

( * ) Notice: Subject to any disclaimer, the term of this patent is extended or adjusted under 35 U.S.C. 154(b) by 1167 days.

(21) Appl. No.: 11/382,950

(22) Filed: May 12, 2006

(65) Prior Publication Data
US 2006/0257796 A1 Nov. 16, 2006

(30) Foreign Application Priority Data
May 16, 2005 (JP) ............................. 2005-142192

(51) Int. Cl.
*B41M 5/00* (2006.01)

(52) U.S. Cl. .................. 428/195.1; 428/90; 438/638; 438/625; 438/627; 438/629; 438/637; 438/641; 438/669; 438/671; 438/674; 438/678; 29/825; 29/830; 29/831; 29/846; 29/848; 29/850; 235/490; 235/494; 235/492; 257/E21.001

(58) Field of Classification Search .................. 428/90, 428/195.1; 235/490, 494, 492; 349/153, 349/155, 190, 156; 438/584, 638, 625, 627, 438/629, 637, 641, 669, 671, 674, 678; 257/E21.001; 29/825, 830, 831, 846, 848, 850
See application file for complete search history.

(56) References Cited

U.S. PATENT DOCUMENTS

| | | | | |
|---|---|---|---|---|
| 6,028,362 A | * | 2/2000 | Omura | 257/774 |
| 6,541,861 B2 | * | 4/2003 | Higashi et al. | 257/751 |
| 7,199,033 B2 | | 4/2007 | Hirai et al. | |
| 7,335,991 B2 | * | 2/2008 | Hirai et al. | 257/775 |
| 7,365,008 B2 | | 4/2008 | Hirai et al. | |
| 2004/0005739 A1 | * | 1/2004 | Furusawa | 438/149 |
| 2004/0017152 A1 | * | 1/2004 | Hashimoto et al. | 313/505 |
| 2004/0061822 A1 | * | 4/2004 | Takeda et al. | 349/123 |
| 2004/0079941 A1 | * | 4/2004 | Yamazaki et al. | 257/40 |
| 2005/0140016 A1 | * | 6/2005 | Shim et al. | 257/774 |
| 2006/0065897 A1 | * | 3/2006 | Hirai et al. | 257/72 |

FOREIGN PATENT DOCUMENTS

CN 1574207 2/2005

(Continued)

*Primary Examiner*—Mark Ruthkosky
*Assistant Examiner*—Tamra L Amakwe
(74) *Attorney, Agent, or Firm*—Harness, Dickey & Pierce, P.L.C.

(57) ABSTRACT

There is provided a bank structure which partitions off a pattern formation region in which a functional liquid is to be disposed and flow. The pattern formation region includes a first pattern formation region, and a second pattern formation region which is continuously connected to the first pattern formation region and which has a larger width than the first pattern formation region. The second pattern formation region is provided with at least one partition bank which partitions off the second pattern formation region to regulate the flow direction of the functional liquid. A partition width substantially orthogonal to the flow direction of the functional liquid which is regulated by the partition bank is less than ±20% of the width of the first pattern formation region.

4 Claims, 11 Drawing Sheets

FOREIGN PATENT DOCUMENTS

| | | |
|---|---|---|
| JP | 11-274671 | 10/1999 |
| JP | 2000-216330 | 8/2000 |
| JP | 2003121635 A * | 4/2003 |
| JP | 2005-012181 | 1/2005 |
| JP | 2005-032835 | 2/2005 |
| JP | 2005-353772 | 12/2005 |
| JP | 2006-293291 | 10/2006 |

* cited by examiner

DEVELOPMENT PROCESSING

BANK STRUCTURE, WIRING PATTERN FORMING METHOD, DEVICE, ELECTRO-OPTICAL DEVICE, AND ELECTRONIC APPARATUS

BACKGROUND

1. Technical Field

The invention relates to a bank structure, a pattern forming method, a device, an electro-optical device, and an electronic apparatus.

2. Related Art

As a method of forming wiring composed of a predetermined pattern used for electronic circuits or integrated circuits, for example, photolithography is used widely. Photolithography requires large-scale apparatuses, such as a vacuum apparatus and an exposure apparatus. Also, there is a problem with the above apparatuses in that complicated steps are required in order to form wiring composed of a predetermined pattern, and the manufacturing cost is high because the use efficiency of a material for the wiring is merely about several percent and most of the material is consequently discarded.

To cope with this, a method of forming wiring composed of a predetermined pattern on a substrate using a droplet discharge method, i.e., a so-called ink jet method by which a liquid material is discharged in the shape of droplets from a liquid discharge head has been suggested (for example, refer to JP A-11-274671 and JP A-2000-216330). In this ink jet method, a liquid material for patterns (functional liquid) is directly disposed in patterns on a substrate, and thereafter heat treatment and laser irradiation are performed to form desired patterns. Accordingly, according to this method, since a photolithographic step becomes unnecessary and consequently a whole process can be simplified significantly and a raw material can be directly disposed in a pattern position, there is a merit that the amount used can also be reduced.

Meanwhile, in recent years, the densification of circuits which constitute a device has progressed, for example, the production of narrower and thinner wiring has been demanded. However, with the pattern forming method using the above-mentioned droplet discharge method, since a discharged droplet spreads on a substrate after it has landed on the substrate it is difficult to form a fine pattern stably. Particularly when a pattern is intended to be used as a conductive film, there is a possibility that a liquid pool (bubble) may be generated by the above-mentioned spreading of a droplet which causes defects, such as breaking of wires and short-circuiting. Thus, a technique using a bank structure provided with a wide wiring formation region and a fine wiring formation region formed to be connected to this wiring formation region has also been suggested (for example, refer to JP A-2005-12181). According to this technique, a functional liquid is discharged to the wide wiring formation region, and the functional liquid is allowed to flow into the fine wiring formation region by capillary action to form a fine wiring pattern.

Here, If the difference between the width of the fine wiring formation region and the width of a wiring formation region where a functional liquid is to be discharged becomes large, since the functional liquid generally flows along a bank which partitions off the wide wiring formation region, the amount of inflow of the functional liquid into the fine wiring formation region by capillary action will be insufficient. Then, there is a problem that the film thickness of a formed fine wiring pattern may become small compared with that of other wiring patterns. Thus, for example, a method in which a part of the wider wiring formation region is narrowed to increase the amount of inflow of the functional liquid from this wiring formation region to the fine wiring formation region to make the fine wiring pattern thick can be considered.

However, as described above, when the amount of the functional liquid which flows into a fine wiring formation region (first pattern formation region) is increased by narrowing a part of the wiring formation region (pattern formation region), it is difficult to appropriately regulate the amount of inflow of the functional liquid. For example, if an excessive amount of functional liquid flows into the wiring formation region, the film thickness of the fine wiring pattern will become thick compared with that of other wiring patterns. As a result, a difference will be caused in film thickness between the fine wiring portion and other wiring portions.

Then, for example, when this technique is intended to be applied to the formation of gate wiring and a gate electrode continuously connected thereto, the film thickness differs between the gate wiring and the gate electrode. As a result, stable transistor characteristics will be sufficiently acquired.

SUMMARY

An advantage of the invention is that it provides a bank structure, a film pattern forming method, a device, an electro-optical device, and an electronic apparatus which, when a functional liquid is disposed in pattern formation regions having different widths, a difference in film thickness between film patterns to be formed is eliminated.

According to a first aspect of the invention, a bank structure is provided which partitions off a pattern formation region in which a functional liquid is to be disposed and flow. The pattern formation region includes a first pattern formation region, and a second pattern formation region which is continuously connected to the first pattern formation region and which has a larger width than the first pattern formation region. The second pattern formation region is provided with at least one partition bank which partitions off the second pattern formation region to regulate the flow direction of the functional liquid. A partition width substantially orthogonal to the flow direction of the functional liquid which is regulated by the partition bank is less than ±20% of the width of the first pattern formation region.

In a case in which a functional liquid having the same flight diameter as the width of the second pattern formation region is disposed in the second pattern formation region by a droplet discharge method, the flow direction of the functional liquid will be regulated by a partition bank provided in the second pattern formation region. Moreover, since the second pattern formation region is provided with the partition bank which regulates the flow direction of a functional liquid so that the partition width may be set to less than ±20% of the first pattern formation region, the width that regulates flow of a functional liquid becomes substantially equal in the whole pattern formation region. Therefore, a functional liquid will have the same flow in the whole pattern formation region, and consequently the functional liquid spreads uniformly between the second pattern formation region and the first pattern formation region.

Therefore, the thickness of a film pattern to be formed in the first pattern formation region and the thickness of a film pattern to be formed in the second pattern formation region can be made approximately equal to each other.

Preferably, in the above bank structure, the partition bank is formed to be lower than the height of the internal surface of a bank which partitions off the pattern formation region.

Thus, when a functional liquid is disposed in the second pattern formation region, the functional liquid can also be disposed on the partition bank. Therefore, compared with a case in which a film pattern is not formed on the partition bank, a pattern to be formed in the second pattern formation region can take a large cross-sectional shape, and an increase in the electrical resistance when this film pattern is used as a conductive pattern can be prevented.

According to a second aspect of the invention, there is provided a method of disposing a functional liquid in a pattern formation region partitioned off by a bank provided on a substrate to form a film pattern. The method includes depositing a bank-forming material onto the substrate, performing a predetermined treatment on the bank-forming material to form a bank formation region having a first pattern formation region, and a second pattern formation region which is continuously connected to the first pattern formation region and is wider than the first pattern formation region, disposing a functional liquid in the second pattern formation region to induce the flow of the functional liquid from the second pattern formation region to the first pattern formation region by capillary action, and curing the functional liquid disposed in the first pattern formation region and the second pattern formation region to form a film pattern. When the pattern formation region is formed, the second pattern formation region is provided with at least one partition bank which partitions off the second pattern formation region to regulate the flow direction of the functional liquid, and whose partition width substantially orthogonal to the flow direction of the functional liquid is less than ±20% of the width of the first pattern formation region.

According to the film pattern forming method of the second aspect of the invention, the pattern formation region including the first pattern formation region, and the second pattern formation region provided with a partition bank which regulates the flow direction of a functional liquid so that the partition width may be set to less than ±20% of the first pattern formation region, is formed. Therefore, the flow direction of the functional liquid discharged to the second pattern formation region is regulated by the partition bank. In this case, as described above, since the partition width of the second pattern formation region is less than ±20% of the width of the first pattern formation region, the width which regulates flow of a functional liquid is made substantially equal in the whole pattern formation region.

Moreover, a functional liquid will have the same flow in the whole pattern formation region, and consequently the functional liquid spreads uniformly between the second pattern formation region and the first pattern formation region.

Also, the thickness of a film pattern to be formed in the first pattern formation region and the thickness of a film pattern to be formed in the second pattern formation region can be made approximately equal to each other by curing the functional liquid disposed as such.

According to the invention, a film thickness difference can be eliminated even between film patterns having different widths.

Preferably, in the above film pattern forming method, the partition bank is formed to be lower than the height of a bank which partitions off the pattern formation region.

Thus, when a functional liquid is disposed in the second pattern formation region, the functional liquid can also be disposed on the partition bank. Therefore, compared with a case in which a film pattern is not formed on the partition bank, a pattern to be formed in the second pattern formation region can take a large cross-sectional shape. Also, when this pattern is used as a conductive pattern, an increase in electrical resistance can be prevented.

Preferably, in the above film pattern forming method, when photolithography is used as the predetermined treatment, a portion of the bank-forming material serving as the partition bank is selectively irradiated with light through a halftone mask, and thereafter development processing is performed to form a pattern formation region.

Thus, the exposure value of a partition bank portion can be regulated selectively, and the height of the partition bank can be formed to be smaller than the height of the other bank, by using a halftone mask in an exposure step. Moreover, since a mask part having an exposure value corresponding to the partition bank portion and a mask part corresponding to other bank parts are provided on the same mask, the first pattern formation region and the second pattern formation region are formed by one exposure step, and the steps by photolithography can be simplified.

According to a third aspect of the invention, there is provided a device including the above bank structure, and a film pattern formed in the pattern formation region in the bank structure.

According to the device of the third aspect of the invention, since the film pattern is formed in the pattern formation region partitioned off by the bank structure as described above, a film thickness difference in a film pattern made of a functional liquid disposed in the first pattern formation region and the second pattern formation region can be eliminated substantially. Therefore, it is possible to obtain a device with excellent electrical characteristics that breaking of wires or short-circuiting in a case in which other thin film patterns are laminated on this film pattern is prevented.

In the above device, preferably, the film pattern formed in the second pattern formation region is used as gate wiring and the film pattern formed in the first pattern formation region is used as a gate electrode.

Thus, the film thicknesses of gate wiring and a gate electrode can be made approximately equal to each other by using the above-described bank structure. As a result, transistor characteristics can be stabilized, and the reliability of a pixel provided with this transistor can be enhanced.

In the above device, preferably, the film pattern formed in the second pattern formation region is used as source wiring and the film pattern formed in the first pattern formation region is used as a source electrode.

Thus, the film thicknesses of source wiring and a source electrode can be made approximately equal to each other by using the above-described bank structure. As a result, transistor characteristics can be stabilized, and the reliability of a pixel provided with this transistor can be enhanced.

According to a fourth aspect of the invention, there is provided an electro-optical device including the above device.

According to the electro-optical device of the invention, since it has a device with high-precision electrical properties, etc., the electro-optical device with improved quality and performance can be realized.

Here, the electro-optical device in the invention generically includes an electro-optical device which converts electrical energy to optical energy, in addition to an electro-optical device which has an electro-optical effect that a change in the refractive index of a substance changes by an electric field changes the transmittance of light. As the electro-optical device, specifically, there are a liquid crystal display device using liquid crystal as electro-optical substance, an organic EL device using organic electro-luminescence as electro-optical substance, a plasma display device using plasma gas as electro-optical substance, etc. Furthermore, there are an electrophoretic display (EPD) device, a field emission display (FED) device, etc.

According to a fifth aspect of the invention, there is provided an electronic apparatus including the above electro-optical device. According to the electronic apparatus of the invention, since it includes the electro-optical device with improved quality and performance, the reliability of the electronic apparatus can be can be enhanced.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
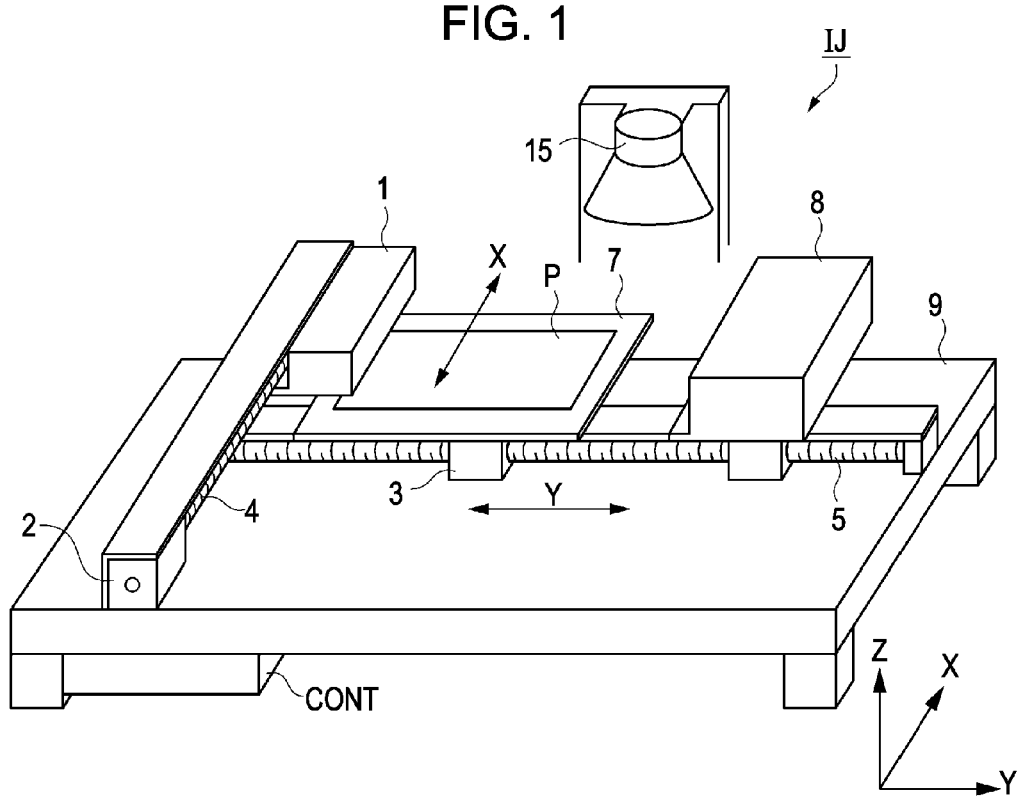
FIG. 1 is a perspective view showing the schematic configuration of a droplet discharge apparatus of the invention.

Hereinafter, one embodiment of the invention will be described with reference to the accompanying drawings. In addition, the embodiment to be described below shows some aspects of the invention, but the invention is not limited to the aspects. In addition, scales of individual layers and members in all the drawings to be used for the description below are appropriately changed so that the individual layers and members have recognizable sizes in the drawings.

Droplet Discharge Apparatus

First, in this embodiment, a droplet discharge apparatus for forming a film pattern will be described with reference to FIG. 1.

FIG. 1 is a perspective view showing a schematic configuration of a droplet discharge apparatus (ink jet apparatus) IJ which arranges a liquid material onto a substrate by a droplet discharge method as an example of an apparatus used for a film pattern forming method of the invention.

The droplet discharge apparatus IJ includes a droplet discharge head 1, an X-axis-direction driving shaft 4, a Y-axis-direction guide shaft 5, a controller CONT, a stage 7, a cleaning mechanism 8, a base 9, and a heater 15.

The stage 7 is for supporting a substrate 48 (as will be described below) on which ink (liquid material) is provided by this droplet discharge apparatus IJ, and includes a fixing mechanism (not shown) which fixes the substrate 48 at a reference position.

The droplet discharge head 1 is a multinozzle-type droplet discharge head provided with a plurality of discharge nozzles having a longitudinal direction matching the Y-axis direction. The plurality of discharge nozzles are provided at regular intervals in the Y-axis direction on the lower surface of the droplet discharge head 1. Ink containing the above-mentioned conductive fine particles is discharged from the discharge nozzles of the droplet discharge head 1 onto the substrate 48 supported by the stage 7.

An X-axis-direction driving motor 2 is connected to the X-axis-direction driving shaft 4. The X-axis-direction driving motor 2 is a stepping motor or the like, which rotates the X-axis-direction driving shaft 4 when an X-axis-direction driving signal is supplied from the controller CONT. When the X-axis-direction driving shaft 4 rotates, the droplet discharge head 1 moves in the X-axis direction.

The Y-axis-direction guide shaft 5 is fixed so as not to move with respect to the base 9. The stage 7 includes a Y-axis-direction driving motor 3. The Y-axis-direction driving motor 3 is a stepping motor or the like which moves the stage 7 in the Y-axis direction when a Y-axis-direction driving signal is supplied from the controller CONT.

The controller CONT supplies a voltage for droplet discharge control to the droplet discharge head 1. The controller CONT also supplies a driving pulse signal, which controls the movement of the droplet discharge head 1 in the X-axis direction, to the X-axis-direction driving motor 2, and supplies a driving pulse signal, which controls movement of the stage 7 in the Y-axis direction, to the Y-axis-direction driving motor 3.

The cleaning mechanism 8 is a mechanism for cleaning the droplet discharge head 1. The cleaning mechanism 8 includes a Y-axis-direction driving motor (not shown). By driving of this Y-axis-direction driving motor, the cleaning mechanism is moved along the Y-axis-direction guide shaft 5. The movement of the cleaning mechanism 8 is also controlled by the controller CONT.

Here, the heater 15 is a device for heat treating the substrate 48 by lamp annealing, which evaporates and dries a solvent contained in a liquid material coated on the substrate 48. Power ON/OFF of this heater 15 is also controlled by the controller CONT.

The droplet discharge apparatus IJ discharges droplets onto the substrate 48 while relatively scanning the stage 7 supporting the droplet discharge head 1 and the substrate 48. Here, in the following description, the disposition is such that the X-axis direction is the scanning direction and the Y-axis direction orthogonal to the X-axis direction is the nonscanning direction. Accordingly, the discharge nozzles of the droplet discharge head 1 are provided at regular intervals in the Y-axis direction which is the nonscanning direction. In FIG. 1, the droplet discharge head 1 is disposed at a right angle with respect to the running direction of the substrate 48. However, the disposition may be such that the angle of the droplet discharge head 1 is adjusted to intersect the running direction of the substrate 48. Thus, the pitch of nozzles may be regulated by adjusting the angle of the droplet discharge head 1. Moreover, the disposition may be such that the distance between the substrate P and the nozzle surface can be arbitrarily controlled.

Figure 2:
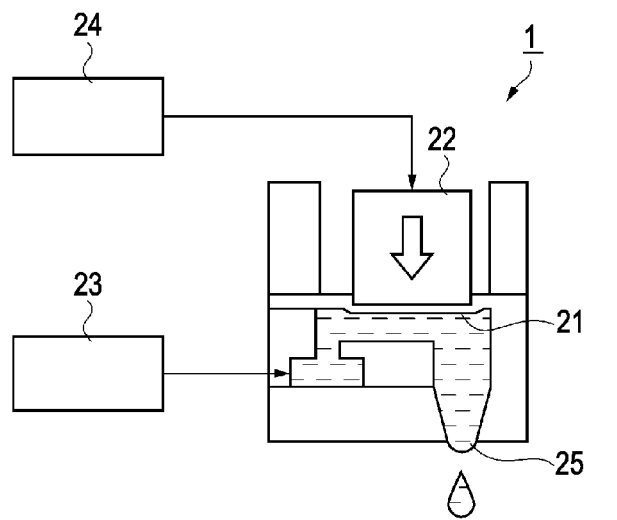
FIG. 2 is a diagram for explaining the principle of discharging a liquid material by a piezo method.

FIG. 2 is a diagram for explaining the principle of discharging a liquid material by a piezo method.

In FIG. 2, a piezo element 22 is installed adjacent to a liquid chamber 21 which accommodates a liquid material (wiring pattern ink, functional liquid). The liquid material is supplied into the liquid chamber 21 via a liquid material supply system 23 including a material tank which accommodates the liquid material.

The piezo element 22 is connected to a driving circuit 24. A voltage is applied to the piezo element 22 through this driving circuit 24 so as to deform the piezo element 22, so that the liquid chamber 21 is deformed to discharge the liquid material from the nozzle 25. In this case, the amount of distortion of the piezo element 22 is controlled by changing the value of the applied voltage. Moreover, the speed of distortion of the piezo element 22 is controlled by changing the frequency of the applied voltage.

In addition, as the principles of discharging a liquid material, various known techniques can be applied, such as a bubble method in which a liquid material is discharged by bubbles which are generated by heating the liquid material in addition to the piezo method which discharges ink using a piezoelectric element which is the above-mentioned piezo element. Among them, the above-mentioned piezo method has an advantage that composition, etc. of a material is not affected because heat is not applied to a liquid material.

Here, the functional liquid L includes a dispersion liquid in which conductive fine particles are dispersed in a dispersion medium and a solution in which organic silver compounds or silver oxide nanoparticles are dispersed in a solvent (dispersion medium).

As the conductive fine particles, for example, metal fine particles containing at least one of gold, silver, copper, aluminum, palladium, and nickel, oxides thereof, and fine particles of conductive polymers or superconductors may be used.

To improve the dispersibility of these conductive fine particles, organic matter may be coated on the surface for use. Examples of coatings that may be coated on the surface of the conductive fine particles include organic solvents such as xylene, toluene, or citric acid.

The diameter of the conductive fine particles is preferably 1 nm or more and below 0.1 μm or less. If the diameter is larger than 0.1 μm, clogging at the nozzle of a liquid discharge head as will be described below may occur. If the diameter is smaller than 1 nm, the volume ratio of a coating agent with respect to conductive fine particles is increased, causing an excessive ratio of organic matter in a film to be obtained.

The dispersion medium is not particularly restricted provided the above-mentioned conductive fine particles can be dispersed therein without causing agglomeration of the fine particles. Examples of the dispersion medium may include water, alcohols, such as methanol, ethanol, propanol, and butanol; hydrocarbon compounds such as n-heptane, n-octane, decane, dodecane, tetradecane, toluene, xylene, cymene, durene, indene, dipentene, tetrahydro naphthalene, decahydro naphthalene, and cyclohexyl benzene; ether compounds, such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxy ethane, bis(2-methoxy ethyl)ether, and p-dioxan; and polar compounds, such as propylene carbonate, γ-butyrolactone, N-methyl-2-pyrrolidone, dimethyl formamide, dimethyl sulfoxide, and cyclohexanone, and the like. Among the above compounds, from the viewpoint of the dispersibility of fine particles, the stability of a dispersion liquid, and the ease of application to the liquid droplet discharge method (ink jet method), water, alcohols, hydrocarbon compounds, and ether compounds are preferable as the dispersion medium, and water and hydrocarbon compounds are more preferable as the dispersion medium.

It is preferable that the surface tension of the dispersion liquid of the above conductive fine particles be in a range of 0.02 N/m to 0.07 N/m. When liquid is discharged using the droplet discharge method, if the surface tension is less than 0.02 N/m, the wettability of the ink composition with respect to the nozzle surface increases so that the discharge direction tends to deviate, and if the surface tension exceeds 0.07 N/m, the shape of the meniscus at the tip of the nozzle becomes unstable, making it difficult to control the discharge amount and the discharge timing. In order to control the surface tension, a small amount of surface tension modifier such as a fluorine group, silicon group, or nonionic group is desirably added to the above dispersion liquid to such an extent that the contact angle with the substrate is not markedly reduced. The nonionic surface tension modifier increases the wettability of liquid to the substrate, improves the leveling property of a film, and helps to prevent the occurrence of minute irregularities on the film. The above surface tension modifier may contain organic compounds, such as alcohol, ether, ester, and ketone, if necessary.

It is preferable that the viscosity of the above dispersion liquid be 1 mPa·s or more and 50 mPa·s or less. When a liquid material is discharged in droplets using the droplet discharge method, if the viscosity is smaller than 1 mPa·s, the area surround the nozzle is easily contaminated due to outflow of ink, and if the viscosity is higher than 50 mPa·s, the frequency of clogging in the nozzle hole increases, making it difficult to smoothly discharge droplets.

Bank Structure

Figure 3A:
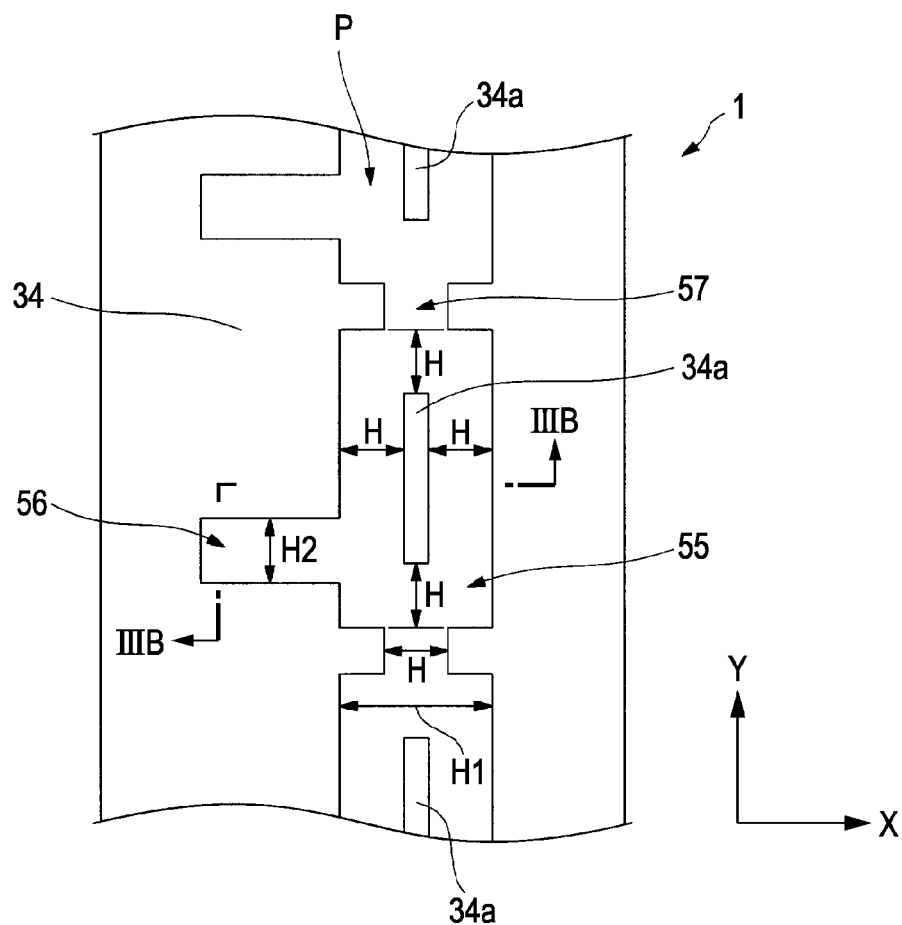
FIG. 3A is a plan view of a bank structure.

Next, a bank structure which facilitates disposition of a functional liquid (ink) in this embodiment will be described with reference to FIGS. 3A and 3B. FIG. 3A is a plan view showing the schematic configuration of a bank structure 1.

Figure 3B:
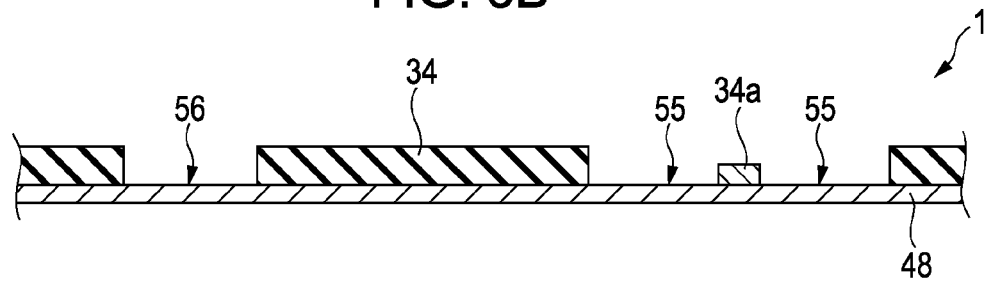
FIG. 3B is a sectional side view of FIG. 3A.

Moreover, FIG. 3B is a sectional side view of the bank structure 1 taken along the line A-A' shown in FIG. 3A. In the bank structure 1 of this embodiment, as shown in FIGS. 3A and 3B, a bank 34 is formed on the substrate 48. Also, a pattern formation region P which becomes a region in which a functional liquid is to be disposed is partitioned off by this bank 34. In addition, the pattern formation region P of this embodiment is a region provided on the substrate 48 for forming gate wiring and a gate electrode which constitute a TFT as will be described below.

The pattern formation region P is composed of a grooved first pattern formation region 55 corresponding to gate wiring (film pattern), and a second pattern formation region 56 which is connected with this first pattern formation region 55, and is corresponding to a gate electrode (film pattern). Here, the "corresponding" means that the first pattern formation region 55 or the second pattern formation region 56 becomes gate wiring or a gate electrode by performing curing treatment, etc. on the functional liquid disposed in the first and second pattern formation regions.

Specifically, as shown in FIG. 3A, the first pattern formation region 55 is formed to extend in the Y-axis direction in FIG. 3A. Also, the second pattern formation region 56 is formed substantially perpendicularly (X-axis direction in FIG. 3A) to the first pattern formation region 55, and is provided to be continued (connected) to the first pattern formation region 55.

Moreover, the width of the first pattern formation region 55 is larger than the width of the second pattern formation region 56. In this embodiment, the width of the first pattern formation region 55 is substantially equal to or slightly larger than the flight diameter of the functional liquid discharged from the droplet discharge apparatus IJ. Adoption of such a bank structure 1 allows the functional liquid discharged to the first pattern formation region 55 to flow into the second pattern formation region 56 that is a fine pattern by capillary action.

In addition, the width in each of the pattern formation regions 55 and 56 indicates the length between the ends of each of the pattern formation regions 55 and 56 in a direction orthogonal to the direction (X, Y) that each of the patterns 55 and 56 extends. Here, as shown in FIG. 3A, the width of the first pattern formation region 55 is set to H1, and the width of the second pattern formation region 56 is set to H2.

Moreover, as shown in FIG. 3A, the first pattern formation region 55 of this embodiment is provided with a throttling part (first pattern formation region) 57 which regulates the amount of inflow of the functional liquid disposed in the first pattern formation region 55, into the second pattern formation region 56 and whose width is smaller than the other first pattern formation region. Also, in this embodiment, the width of the throttling part 57 is made equal to the width (H2) of the second pattern formation region 56.

This throttling part 57 corresponds to the portion (intersecting part) where gate wiring and source wiring intersect. Similarly, a throttling part is also formed in the intersection part on the side of source wiring (refer to FIG. 6). In this way, the width of each wiring is reduced in the intersecting part of the gate wiring and the source wiring so as to prevent the capacity from being stored in the intersecting part.

Meanwhile, the functional liquid disposed in the region partitioned off by the bank 34 flows along the internal surface of the bank 34.

Also, partition banks 34a which partition off the pattern formation region 55 are formed in the first pattern formation region 55 in which the throttling part 57 is not formed so as to extend in the direction in which the first pattern formation region 55 extends. In this way, the functional liquid disposed in the first pattern formation region 55 will flow along the internal surfaces of the bank 34 and the partition banks 34a by partitioning off the first pattern formation region 55 by the partition banks 34a. That is, each partition bank 34a regulates the direction in which a functional liquid to be disposed in the first pattern formation region 55 flows.

Here, the width in a direction substantially orthogonal to the regulated flow direction of a functional liquid is set to a partition width H shown FIG. 3A so that the liquid may flow along with the bank 34 and the partition bank 34a. In this case, as for the second pattern formation region 56 and the throttling part 57, the bank 34 which partitions off these is set to the width H2 as mentioned above, and accordingly the partition width H in each the regions 56 and 57 can be considered the width H2.

In the invention, the partition bank 34a is formed in the first pattern formation region 55 so that the partition width H may be less than ±20%, more preferably ±10% of the width H2 of the second pattern formation region 56 and the throttling part 57. Therefore, the partition width H which flows through the inside of the first pattern formation region (including the throttling part 57) 55, and the partition width H (H2) which flows through the inside of the second pattern formation region 56 are substantially equal to each other. In this way, in this bank structure 1, the partition width H, i.e., the state where flow of a functional liquid is regulated is equal substantially in the whole pattern formation region P. Therefore, according to this bank structure 1, a functional liquid will have the same flow in the whole pattern formation region P, and consequently the functional liquid spreads uniformly between the second pattern formation region and the first pattern formation region.

As shown in FIG. 3B, the height of the partition bank 34a is made smaller than the height of the other bank 34 which partitions off the pattern formation region P. By such s configuration, when a functional liquid is disposed in the first pattern formation region 55, the functional liquid is also disposed on the partition bank 34a. Therefore, since the partition bank 34a is formed in the same height as the other bank 34, compared with a case in which a film pattern is not formed on the partition bank 34a, a film pattern (gate wiring) to be formed in the first pattern formation region can take a large cross-sectional shape, and an increase in the electrical resistance in a case in which this film pattern is used as a conductive pattern is prevented.

In addition, if the width H2 of the second pattern formation region 56 corresponding to a gate electrode is 10 μm, it is preferable that the width of the partition bank 34a be 3 μm or more. If the partition width H satisfies the above-mentioned conditions (less than ±20% of the width H2), for example, the bank structure 1 in which the width of the partition bank 34a is made substantially equal to the width H2 may be used.

As described above, in a case in which the throttling part 57 which regulates the amount of inflow of the functional liquid into the second pattern formation region 56 as a narrow pattern formation region is provided in the first pattern formation region 55 as a wide pattern formation region, there is a case with the bank structure of related art that a large amount of functional liquid flows into the narrow pattern formation region, and a difference in film thickness between these pattern formation regions may occur.

Therefore, if the invention is adopted, in a case in which a functional liquid is disposed in the first pattern formation region 55 by the droplet discharge method, the flow direction thereof will be regulated by the partition bank 34a provided in this first pattern formation region 55. Moreover, since the first pattern formation region is provided with the partition bank 34a which regulates the flow direction of a functional liquid so that the partition width H may be set to less than ±20% of the second pattern formation region 56, the state where flow of a functional liquid is regulated becomes substantially equal in the whole pattern formation region P. Therefore, a functional liquid will have the same flow in the whole pattern formation region P, and consequently the functional liquid spreads uniformly between the first pattern formation region 55 and the second pattern formation region 56. Therefore, the thickness of a film pattern to be formed in the second pattern formation region 56 and the thickness of a film pattern (gate pattern) to be formed in the first pattern formation region 55 can be made approximately equal to each other.

Bank Structure, and Method of Forming Film Pattern

Next, the method of forming the bank structure 1 in this embodiment and a method of forming gate wiring in the pattern formation region P partitioned off by this bank structure 1 as a film pattern will be described.

FIG. 4 is a side sectional view sequentially showing the steps of forming the bank structure 1. FIGS. 4A to 4D are side sectional views showing the steps of forming a pattern formation region P composed of the first pattern formation region 55 and a second pattern formation region 56, taken along the line A-A' of FIG. 3A. Moreover, FIGS. 5A and 5B are sectional views illustrating the steps of disposing a functional liquid to form a film pattern (gate wiring) in the bank structure 1 formed in the manufacturing process shown in FIGS. 4A to 4D.

Bank Material Coating Step

Figure 4A:
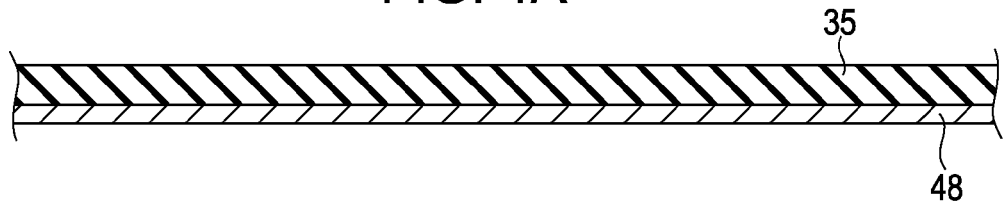
FIGS. 4A to 4D are sectional side views showing the steps of forming a bank structure.
Figure 5A:
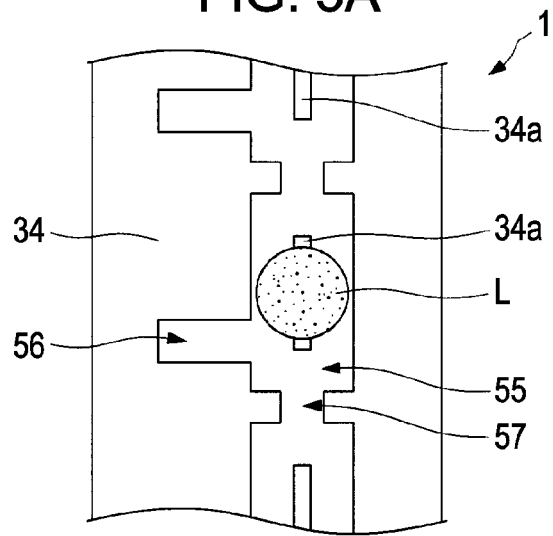
FIGS. 5A to 5C are sectional side views for explaining the steps of forming a wiring pattern.
Figure 5B:
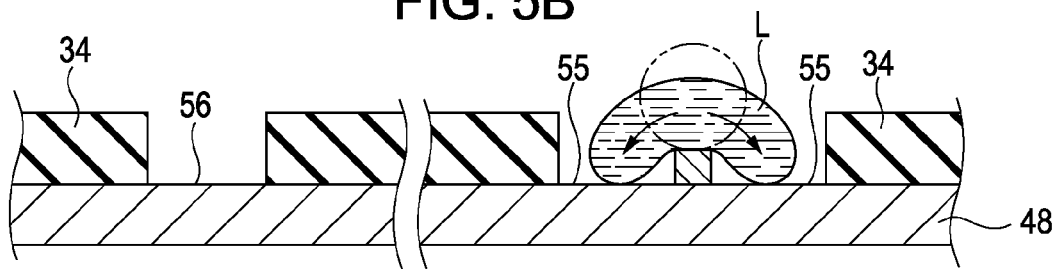

First, as shown in FIG. 4A, a bank-forming material is coated on the entire surface of the substrate 48 by a spin coat method to form a bank layer 35. As the method of coating the bank-forming material, various methods such as spray coating, roll coating, die coating, and dip coating can be applied.

Moreover, as the substrate 48, various materials, such as glass, quartz glass, Si wafer, a plastic film, and a metal plate, can be used. Moreover, as the bank-forming material, for example, there are used materials containing an insulating material and a lyophilic material which consist of photosensitive acrylic resin, polyimide, etc. Thereby, since the bank-forming material also has a function of a resist, a photoresist coating step can be omitted. Moreover, when a grooved pattern formation region P is formed in the bank-forming material by a step as will be described below, the internal surface of the bank which partitions off this pattern formation region P can be made lyophilic in advance.

In addition, foundation layers, such as a semiconductor film, a metal film, a dielectric film, and an organic film may be formed on the surface of the substrate 48.

Lyophobization Step

Next, the surface of the bank layer 35 coated on the entire surface of the substrate 48 is subjected to a plasma treatment in which a gas containing fluorine such as $CF_4$, $SF_5$ or $CHF_3$ is used as a processing gas. The surface of the bank layer 35 is made lyophobic by this plasma treatment. As the lyophobization treatment method, for example, a plasma treatment method ($CF_4$ plasma treatment method) which uses tetrafluoride methane as a processing gas in an atmosphere can be employed. As conditions of such a $CF_4$ plasma treatment, for example, the plasma power may be 50 to 1000 W, the flow rate of the tetrafluoride methane gas may be 50 to 100 mL/min, the relative conveying speed of a base member with respect to a plasma discharge electrode may be 0.5 to 1020 mm/sec, and the temperature of the substrate may be 70 to 90° C.

In addition, the processing gas is not limited to tetrafluoride methane (tetrafluoride carbon), but other fluorocarbon gases can also be used. Moreover, it is also preferable that the above lyophobization treatment be performed after forming a predetermined pattern of a groove portion in a bank material as will be described below. In this case, a microcontact printing method can also be employed. Moreover, it is also preferable to fill a bank material itself with lyophobic components (fluorine group, etc.) in advance instead of such treatment. In this case, a $CF_4$ plasma treatment, etc. can be omitted.

In addition, for example, a self-organizing film may be formed in which each compound is aligned so that a fluroalkyl group may be located on the surface of the film by using a fluoroalkylsilane (FAS). Even in this case, a uniform lyophobic property is imparted to the surface of a bank layer 35.

Examples of the compounds that form the self-organizing film may include fluoroalkylsilane (hereinafter referred to "FAS"), such as heptadecafluoro-1,1,2,2 tetrahydrodesyltriethoxysilane, heptadecafluoro-1,1,2,2 tetrahydrodesyltrimethoxysilane, heptadecafluoro-1,1,2,2 tetrahydrodesyltrichlorosilane, tridecafluoro-1,1,2,2 tetrahydrooctyltriethoxysilane, tridecafluoro-1,1,2,2 tetrahydrooctyltrimethoxysilane, tridecafluoro-1,1,2,2 tetrahydrooctyltrichlorosilane, or trifluoropropyltrimethoxysilane. These compounds may be used independently, or used in combinations of two or more thereof. The self-organizing film consisting of an organic molecular film or the like is formed on the substrate when the above-mentioned raw material compound and the substrate are put in the same airtight container and left for two or three days at room temperature. Although these self-organizing films are formed by a method of forming a self-organizing film in a vapor phase, they can also be formed in a liquid phase. For example, the self-organizing film may be formed on the substrate by soaking the substrate in a solution which contains a raw material compound, and cleaning and drying the substrate.

Exposing Step

Figure 4B:
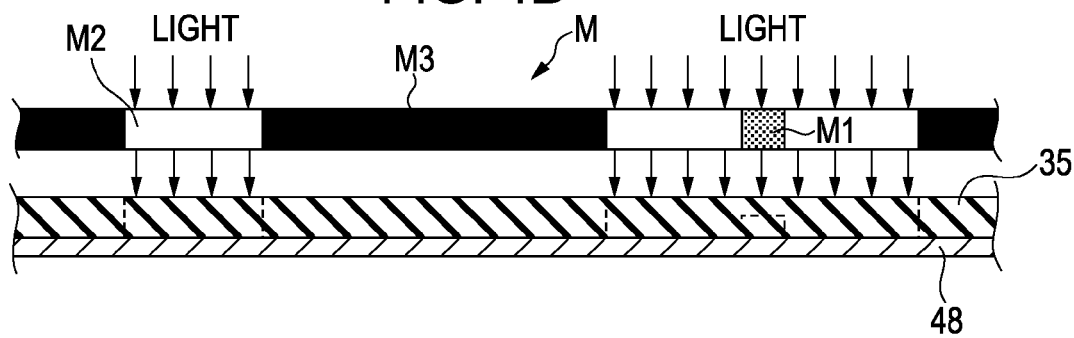

Next, as shown in FIG. 4B, a first pattern formation region 55, a second pattern formation region 56, and a throttling part 57 are formed by irradiating the bank layer 35 through a halftone mask M with the light from an exposure apparatus by using photolithography as a predetermined treatment on the bank layer 35 provided on the substrate 48. In addition, it is premised that a positive resist is used as a photochemical reaction used for development processing according to the following photolithography. Therefore, the bank layer 35 exposed to the light radiated is dissolved and removed by a developing step as will be described below. Then, the bank structure 1 with the pattern formation region P as mentioned above is formed Here, a halftone mask is used when the region used as the partition bank 34a of the first pattern formation region 55 is exposed. The halftone mask M is a mask which has a mask part M3 which completely intercepts the exposing light radiated from an exposure apparatus (not shown), a mask part M2 which allows the exposing light to be completely transmitted therethrough, and a mask part M1 which allows the exposing light to be partially transmitted therethrough. Patterns, such as a diffraction grating composed of slits, are provided in the mask part M1 which allows the exposing light to be partially transmitted therethrough so that the intensity of the light to be transmitted can be controlled. Therefore, the solubility of the bank layer 35 by development processing according to an exposure value can be changed by the light which is transmitted through each of the mask parts M1, M2, and M3. That is, the height of the bank which partitions off the grooved pattern formation region P formed in the bank layer 35 provided on the substrate 48 can be regulated.

The light radiated on the bank layer 35 through the mask part M2 which allows the above exposing light to be completely transmitted therethrough reaches the substrate 48, as shown in FIG. 4B. That is, the region exposed through the mask part M2 becomes the first pattern formation region 55 and the second pattern formation region 56. Moreover, since the quantity of the light radiated on the bank layer 35 through the mask part M1 which allows exposing light to be partially transmitted therethrough is smaller than that in the mask part M2, as shown in FIG. 4B, the light reaches the middle of the bank layer 35, and does not reach the upper surface of the substrate 48. The bank layer 35 exposed in this manner is not dissolved completely by a developing step (refer to FIGS. 4C and 4D) as will be described below, and serves as the partition bank 34a which partitions off the first pattern formation region 55 in the same shape as the mask part M1 in the first pattern formation region 55.

Moreover, similar to the first pattern formation region 55 of the, when the second pattern formation region 56 is formed, the mask part M2 is used in order to allows exposing light to reach the upper surface of the substrate 48.

By this exposure step, as indicated by the two-dot chain line in FIG. 4B, the bank layer 35 is exposed such that the height of the partition bank 34a which partitions off the first pattern formation region 55 becomes smaller than the bank 34 which partitions off the other pattern formation region P.

By such a configuration, when a functional liquid is disposed in the first pattern formation region 55, the functional liquid is also disposed on the partition bank 34a. Therefore, since the partition bank 34a is formed in the same height as the other bank 34, compared with a case in which a film pattern is not formed on the partition bank 34a, a film pattern (gate wiring) to be formed in the first pattern formation region can take a large cross-sectional shape, and an increase in the electrical resistance in a case in which this film pattern is used as a conductive pattern is prevented.

Moreover, in this embodiment, the halftone mask (mask part M1) which forms the partition bank 34a and the mask part which forms the first pattern formation region can be provided on the same mask to form the first pattern formation region 55 and the second pattern formation region 56 by one exposing step, thereby simplifying the exposing step.

Developing Step

Figure 4C:
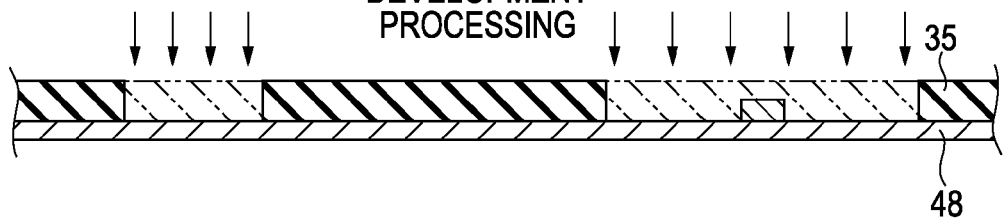

Subsequently, after the above-mentioned exposing step, as shown in FIG. 4C, the exposed bank layer 35 is subjected to development processing with, for example, a TMAH (tetramethyl ammonium hydroxide) developing solution, and thereby a part to be exposed is removed selectively.

Figure 4D:
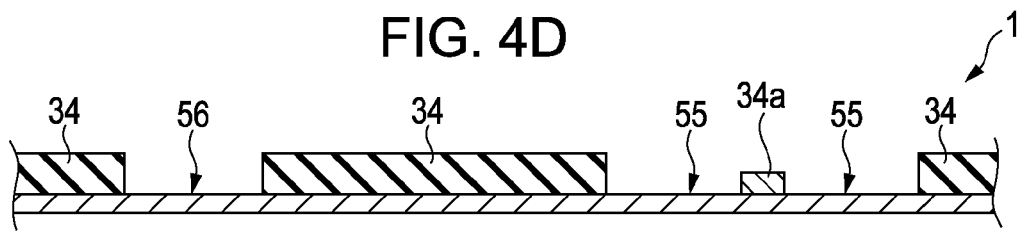

Therefore, as shown in FIG. 4D, the bank structure 1 provided with the pattern formation region P including the second pattern formation region 56 and the first pattern formation region 55 partitioned off by the partition bank 34a can be formed.

In that case, a throttling part (interference part) 57 having a smaller width than the other first pattern formation region 55 is formed in the first pattern formation region 55 in order to regulate the amount of inflow of the functional liquid disposed in the first pattern formation region 55, into the second pattern formation region 56. Also, the width of the throttling part 57 is set to be equal to the width of the second pattern formation region 56. Moreover, the height of the internal surface part 57c of the bank 34c which partitions off the throttling part 57 is smaller than the height of the internal surface part 55a of the other bank 34a which partitions off the first pattern formation region 55 (refer to FIG. 3).

Therefore, similar to the above-mentioned second pattern formation region 56, the throttling part 57 can be formed by performing exposing and development processing using the halftone mask. Thus, the illustration and description thereof in the formation step are omitted herein.

The throttling part 57 formed in this way is for preventing the capacity from being stored in the intersecting portion of the source wiring and gate wiring.

In the bank structure 1 formed in this way, when the direction substantially orthogonal to the flow direction of a functional liquid is set to the partition width H, the partition bank 34a is formed in the first pattern formation region 55 so that the partition width H may be less than ±20%, more preferably ±10% of the width H2 of the second pattern formation region 56 and the throttling part 57.

Therefore, the partition width H which flows through the inside of the first pattern formation region (including the throttling part 57) 55, and the partition width H (H2) which flows through the inside of the second pattern formation region 56 are substantially equal to each other, and the partition width H, that is, the flow of a functional liquid are regulated to be the same in the whole pattern formation region P.

In addition, the surface of the bank 34 has a lyophobic property by a lyophobic treatment of the above-mentioned bank layer 35. Moreover, since the bank layer 35 is made of materials with a lyophilic property, the internal surface of the bank 34 is made lyophilic, and consequently a functional liquid spreads easily. Moreover, since the partition bank 34a is formed by exposing and developing the bank layer 35, the upper surface and side surfaces thereof have a lyophilic property. Therefore, it is preferable to selectively perform lyophobic treatment on the upper surface of the partition bank 34a before the functional liquid as will be described below is disposed. Therefore, flow of a functional liquid can be controlled well by the partition bank 34a. In addition, the lyophobic property in the upper surface of the partition bank 34a is such that, when a sufficient amount of functional liquid is discharged into the first pattern formation region 55, the functional liquid covers the top of the partition bank 34a as will be described below.

Functional Liquid Disposing Step

Next, the steps of disposing (discharging) a functional liquid to the pattern formation region P formed by the bank structure 1 obtained by the above-mentioned steps, using the droplet discharge apparatus IJ, to form gate wiring (film pattern) will be described. Meanwhile, it is difficult to directly dispose the functional liquid L in the second pattern formation region 56 that is a fine wiring pattern. Therefore, it is supposed that the disposition of the functional liquid L to the second pattern formation region 56 is performed by the method in which the functional liquid L disposed in the first pattern formation region 55 is allowed to flow into the second pattern formation region 56 by capillary action, as described above.

First, as shown in FIG. 5A, the functional liquid L as a wiring pattern forming material is discharged to the first pattern formation region 55 by the droplet discharge apparatus IJ. In addition, in FIG. 5A, in order to simplify description, a state where one drop of functional liquid L has been discharged onto one partition bank 34a is illustrated and described.

Figure 5C:
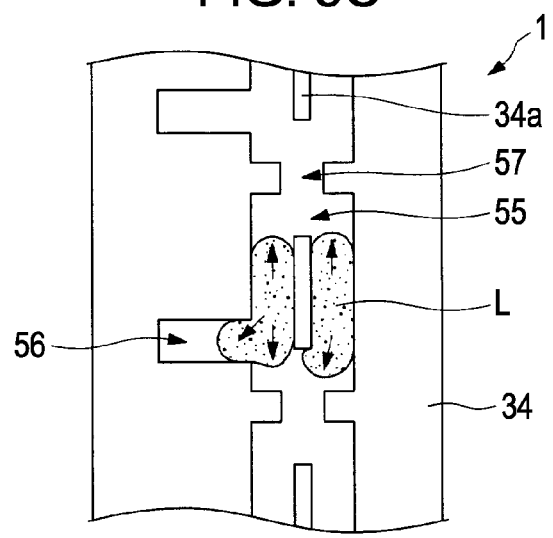

The functional liquid L disposed in the first pattern formation region 55 by the droplet discharge apparatus IJ, as shown in FIG. 5A, rides on the partition bank 34a which partitions off the first pattern formation region 55. Then, the functional liquid L, as shown in FIG. 5B, is repelled by the lyophobic property imparted to the upper surface of the partition bank 34a, and is dropped into the first pattern formation region 55 partitioned off by the partition bank 34a and the bank 34. The functional liquid L dropped into this first pattern formation region 55, as shown in FIG. 5C, flows along the internal surface of the partition bank 34a and the bank 34. Here, in this embodiment, the amount of the functional liquid L flowing into the second pattern formation region 56 is increased by the throttling part 57 provided in the first pattern formation region 55.

In this way, in a case in which the throttling part 57 is provided in the first pattern formation region 55 to regulate the amount of inflow of the functional liquid into the second pattern formation region 56, there is a case with the bank structure of related art that a larger amount of functional liquid L flows into a narrower pattern formation region rather than a wider pattern formation region, and a difference in film thickness may occur between film patterns to be formed in these pattern formation regions.

Thus, in this embodiment, the partition bank 34a which regulates the flow direction of the functional liquid L is formed in the first pattern formation region 55 so that the partition width H may be less than ±20% of the width H2 of the narrow second pattern formation region 56.

Moreover, the flow direction of the functional liquid L discharged to the first pattern formation region 55 is regulated by the partition bank 34a. Also, since the partition width H of the first pattern formation region 55 is less than ±20% of the width of the second pattern formation region, the width which regulates flow of a functional liquid can be made substantially equal in the whole pattern formation region P.

Figure 6A:
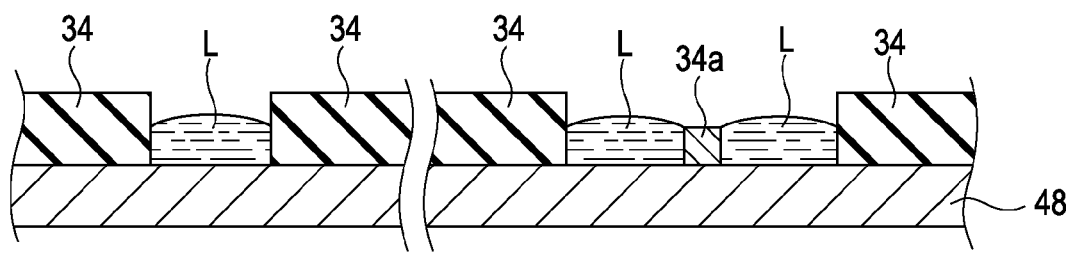
FIGS. 6A to 6C are sectional side views for explaining the steps of forming a wiring pattern.

Based on this configuration, the bank structure 1 allows the discharged functional liquid L to flow similarly in the whole pattern formation region P. Consequently the functional liquid L, as shown in FIG. 6A, spreads uniformly between the first pattern formation region 55 and the second pattern formation region 56.

Meanwhile, the height of the partition bank 34a in this embodiment is made smaller than the height of the other bank 34 which partitions off the pattern formation region P as described above.

Figure 6B:
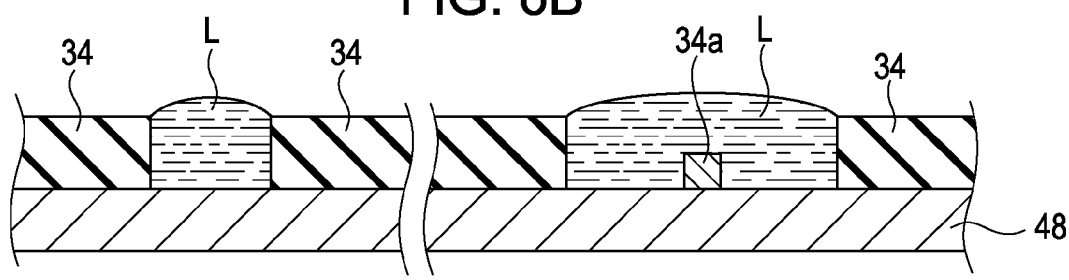

Therefore, if the functional liquid L continues to be discharged in the first pattern formation region 55, the functional liquid L spreads in the width direction of the first pattern formation region 55 soon, and thereby the functional liquid L partitioned off by the partition bank 34a will join together to cover the top of the partition bank 34a. Here, even after the functional liquid L covers the top of the partition bank 34a top, here, the functional liquid L in the first pattern formation region 55 is regulated in the flow direction of the bottom thereof by the partition bank 34a, the functional liquid L, as shown in FIG. 6B, comes to spread uniformly to the whole pattern formation region P including the first pattern formation region 55 and the second pattern formation region 56.

Moreover, compared with a case in which the height of the partition bank 34a and the height the other bank 34 are made equal to each other, and a film pattern is not formed on the partition bank 34a, as in this embodiment, a film pattern to be formed in the second pattern formation region can take a large cross section by making the height of the partition bank 34a smaller than the other bank 34 to allow the functional liquid L to cover the top of the partition bank 34a. Also, when this pattern is used as a conductive pattern, an increase in electrical resistance can be prevented.

Intermediate Drying Step

Subsequently, after the functional liquid L has been disposed in the first pattern formation region 55 and the second pattern formation region 56, drying treatment is performed, if necessary. Thereby, the dispersion medium in the functional liquid L can be removed and the film thickness of a pattern can be ensured. Specifically, the functional liquid L disposed in the first pattern formation region 55 becomes a first wiring pattern 40, and the functional liquid L disposed in the second pattern formation region 56 becomes a second wiring pattern 41.

For example, the above drying treatment can be carried out using an ordinary hot plate which heats the substrate 48, an electric furnace, lamp annealing, and other various methods. Although a light source of the light used for the lamp annealing is not limited especially, it is possible to use an infrared lamp, a xenon arc lamp, a YAG laser, an argon laser, a $CO_2$ gas laser, or an excimer laser such as XeF, XeCl, XeBr, KrF, KrCl, ArF, or ArCl laser, as a light source. Generally, although light sources having an output range of 10 to 5000 W are used as these light sources, those having an output range of 100 to 1000 W are sufficient in this embodiment. Moreover, in order to obtain a desired film thickness, the functional liquid disposing step may be repeated, if necessary, after the intermediate drying step.

Baking Step

In order to obtain conductivity when the conductive material of the functional liquid L is, for example, an organic silver compound after the functional liquid L is disposed, it is necessary to perform heat treatment, to remove an organic matter of the organic silver compound, to make silver particles remain. Therefore, it is preferable to perform heat treatment or optical treatment on the substrate after the functional liquid L is disposed. Although the heat treatment or optical treatment is usually performed in atmospheric air, if necessary, it can also be performed in an atmosphere of inert gas, such as hydrogen, nitrogen, argon, or helium. The treatment temperature of the heat treatment or optical treatment is appropriately determined in consideration of the boiling point (vapor pressure) of a dispersion medium, the type or pressure of an atmospheric gas, thermal behaviors, such as the dispersibility or oxidizing quality of fine particles or organic silver compounds, the existence or amount of a coating agent and the heat resistace of a base material. For example, in order to remove an organic matter of the organic silver compound, it is necessary to bake the substrate at about 200° C. Moreover, when a substrate such as plastic is used, it is preferable that the baking be performed at room temperature or higher and 100° C. or lower.

Figure 6C:
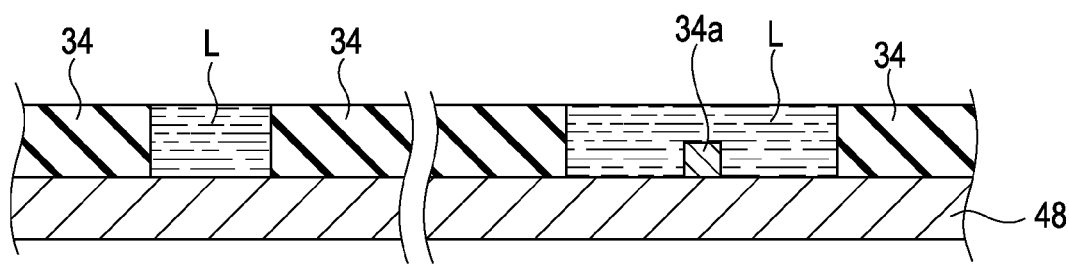

Since the silver particles that are a conductive material (organic silver compounds) of the functional liquid L remain and turn into a conductive film through the above steps, as shown in FIG. 6C, second wiring patterns with little difference in film thickness therebetween, i.e., the first conductive film pattern 40 functioning as a gate electrode and the second wiring pattern 41 functioning as gate wiring can be obtained.

By substantially eliminating a difference in film thickness between gate wiring and a gate electrode in this way, transistor characteristics can be stabilized.

Device

Next, a device provided with the film pattern formed using the bank structure of the invention will be described. In this embodiment, a pixel (device) provided with gate wiring and a method of forming the pixel will be described with reference to FIGS. 7 and 8.

In this embodiment, a pixel which has a gate electrode, a source electrode, a drain electrode, etc. of a bottom-gated TFT 30 is formed using the bank structure and film pattern forming method of the invention. In addition, in the following description, description about the steps similar to the above-described pattern forming steps shown in the FIGS. 5 and 6 is omitted. Moreover, components common to the components shown in the above embodiment are denoted by the same reference numerals.

Structure of Pixel

First, the structure of a pixel provided with the film pattern formed according to this embodiment will be described.

Figure 7:
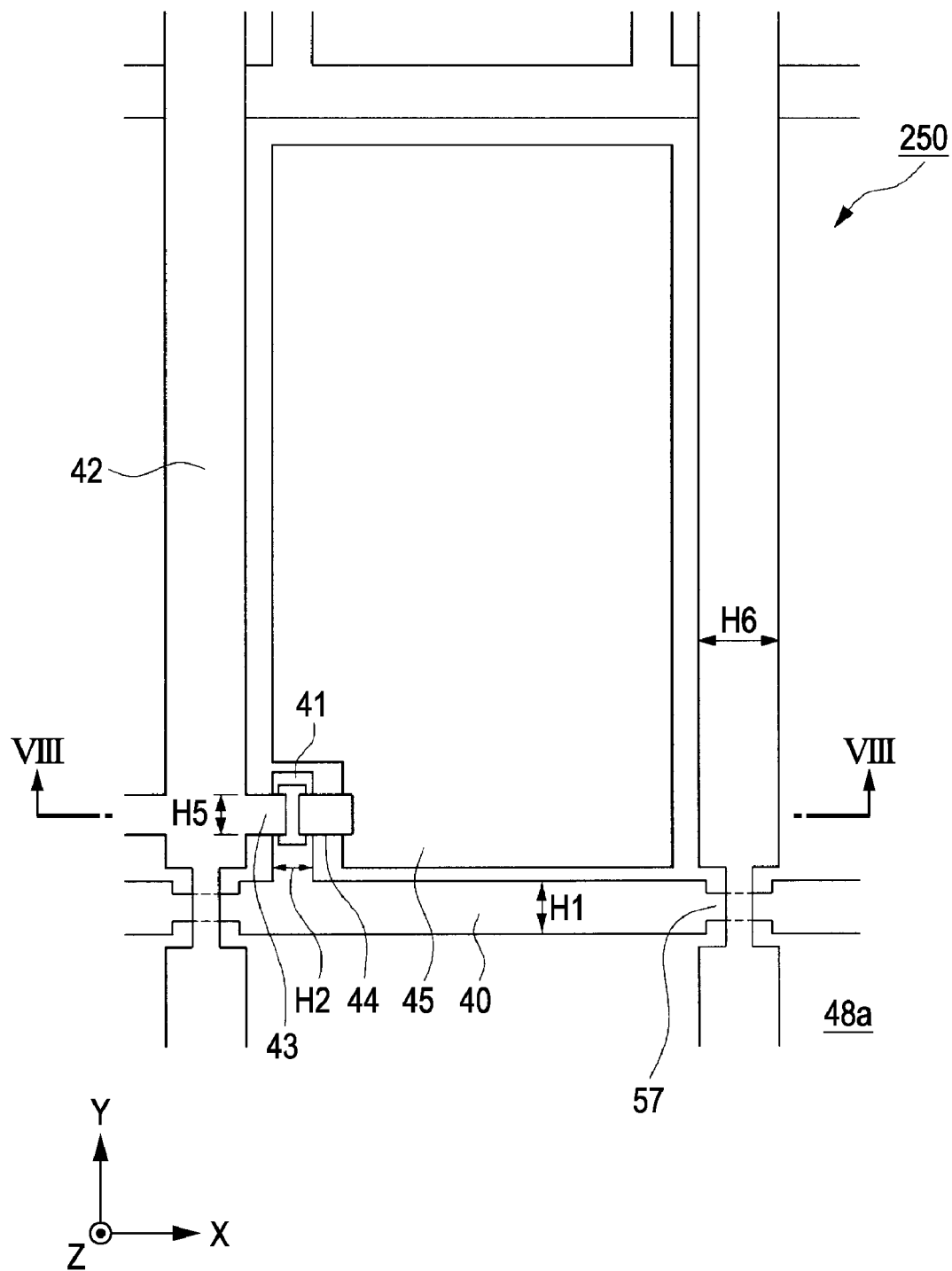
FIG. 7 is a plan view schematically showing one pixel that is a display region.

FIG. 7 is a view showing a pixel structure 250 of this embodiment.

As shown in FIG. 7, the pixel structure 250 includes, on a substrate 48, gate wiring 40 (first wiring pattern), a gate electrode 41 (second wiring pattern) formed to project from this gate wiring 40, source wiring 42, a source electrode 43 formed to project from this source wiring 42, a drain electrode 44, and a pixel electrode 45 electrically connected to the drain electrode 44. The gate wiring 40 is formed to extend in the X-axis direction, and the source wiring 42 formed to intersect the gate wiring 40 and extend in the Y-axis direction. A TFT that is a switching element is formed near the intersection of the gate wiring 40 and the source wiring 42. When this TFT is turned on, a driving current is supplied to the pixel electrode 45 connected to the TFT.

Here, as shown in FIG. 7, the width H2 of the gate electrode 41 is formed more narrowly than the width H1 of the gate wiring 40. For example, the width H2 of the gate electrode 41 is 10 μm, and the width H1 of the gate wiring 40 is 20 μm. This gate wiring 40 and the gate electrode 40 are formed according to the above-described embodiment.

Moreover, the width H5 of the source electrode 43 is formed more narrowly than the width H6 of the source wiring 42. For example, the width H5 of the source electrode 43 is 10 μm, and the width H6 of the source wiring 42 is 20 μm. In this embodiment, a film pattern forming method is applied to allow a functional liquid to flow into the source electrode 43 that is a fine pattern by capillary action to thereby form the source electrode and the source wiring.

Moreover, as shown in FIG. 7, the throttling part 57 having a smaller wiring width than other regions is provided in a portion of the gate wiring 40. The same throttling part is also provided on the source wiring 42 side which intersects the gate wiring 40 on the above throttling part 57. In this way, the width of each wiring is reduced in the intersecting part of the gate wiring and the source wiring so as to prevent the capacity from being stored in the intersecting part.

Method of Forming Pixel

FIGS. 8A to 8E are sectional views showing the steps of forming the pixel structure 250 taken along the C-C' line shown in FIG. 7.

Figure 8A:
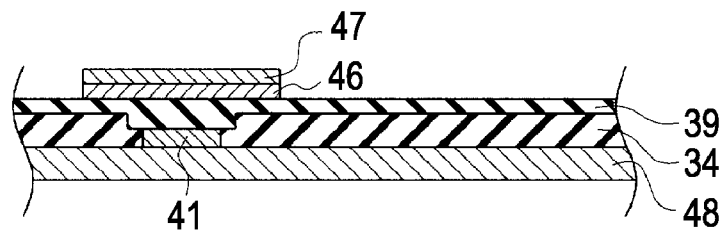
FIGS. 8A to 8E are sectional side views for explaining the steps of forming one pixel.

As shown in FIG. 8A, a gate insulating film 39 is formed as a film by a plasma CVD method, etc. on the surface of the bank 34 including the gate wiring 40 formed by the first embodiment. Here, the gate insulating film 39 is made of silicon nitride. Next, an active layer is formed as a film on the gate insulating film 39. Subsequently, the active layer, as shown in FIG. 8A, is patterned into a predetermined shape by photolithographic treatment and etching treatment to form an amorphous silicon film 46.

Next, a contact layer 47 is formed as a film on the amorphous silicon film 46. Subsequently, the contact layer, as shown in FIG. 8A, is patterned into a predetermined shape by photolithographic treatment and etching treatment. In addition, the contact layer 47 forms an n$^+$-type silicon film by changing a source gas and plasma conditions.

Figure 8B:
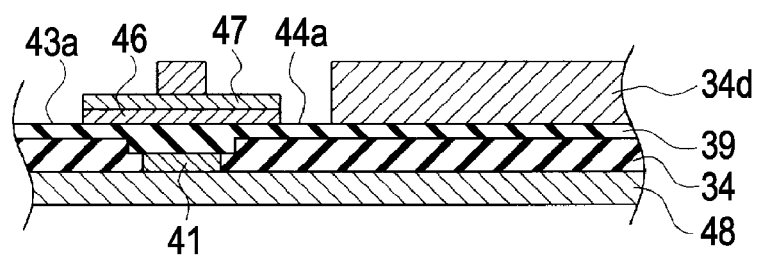

Next, as shown in FIG. 8B, a bank material is coated on the whole surface including the top of the contact layer 47 by a spin coat method, etc. Here, since the banks are required to have light transmittance and a lyophobic property after formation, a high molecular weight material such as acryl resin, polyimide resin, olefin resin, or melanin resin are suitably used as the material for forming the banks. The poly-silazane which has an inorganic skeleton is more preferably used as the material for forming the banks in terms of heat resistance and transmittance in a baking step. Also, in order to impart a lyophobic property to this bank material, CF$_4$ plasma treatment (plasma treatment using a gas which has a fluorine component), etc. is performed. Moreover, it is also preferable to fill a bank material itself with lyophobic components (fluorine group, etc.) in advance instead of such treatment. In this case, a CF$_4$ plasma treatment, etc. can be omitted. As the angle of contact of the bank material made lyophobic in the above manner with respect to the functional liquid L, it is preferable to ensure 40° or more.

Next, a bank 34*d* for source/drain electrodes having a width of 1/20 to 1/10 of the pitch of one pixel is formed. Specifically, a source electrode formation region 43*a* is first formed in a position corresponding to the source electrode 43 of the bank material 34 coated on the upper surface of the gate insulating film 39 by photolithographic treatment, and similarly a drain electrode formation region 44*a* is formed in a position corresponding to the drain electrode 44. At this time, similar to the above first embodiment (not shown), the height of the internal surface part in a bank which partitions off the source electrode formation region 43*a* is smaller than the height of the internal surface of a bank which partitions off a source wiring formation region corresponding to the source wiring 42.

Therefore, a difference in film thickness between the source wiring 42 and the source electrode 43 is prevented.

Figure 8C:
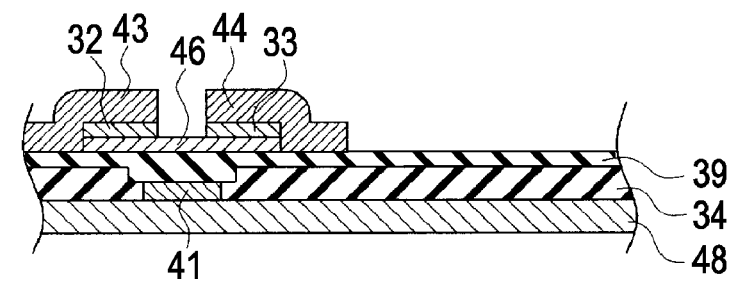

Next, the functional liquid L is disposed in the source electrode formation region 43*a* and the drain electrode formation region 44*a* which are formed in the bank 34*d* for source/drain electrodes, to form the source electrode 43 and the drain electrode 44. Specifically, the functional liquid L is first disposed in the source wiring formation region by the droplet discharge apparatus IJ (not shown). The width H5 of the source electrode formation region 43*a*, as shown in FIG. 7, is made smaller than the width H6 of a groove portion for source wiring. Therefore, the functional liquid L disposed in the groove portion for source wiring is first dammed up by a throttling part provided in the source wiring, and flows into the source electrode formation region 43*a* by capillary action. At this time, a difference in film thickness between the source electrode 43 and the source wiring 42 can be substantially eliminated by adopting the film pattern forming method of the invention. Thereby, as shown in FIG. 8C, a source electrode 43 is formed. Moreover, a functional liquid is discharged to a drain electrode formation region to form a drain electrode 44 (not shown).

Next, as shown in FIG. 8C, after the source electrode 43 and the drain electrode 44 have been formed, the bank 34*d* for source/drain electrodes is removed. Then, the n$^+$-type silicon film of the contact layer 47 formed between the source electrode 43 and the drain electrode 44 is etched by using as a mask each of the source electrode 43 and the drain electrode 44 which has remained on the contact layer 47. The n$^+$-type silicon film of the contact layer 47 formed between the source electrode 43 and the drain electrode 44 is removed by this etching treatment to expose a portion of the amorphous silicon film 46 formed on a lower layer of the n$^+$-type silicon film. In this manner, a source region 32 made of n$^+$ silicon is formed on the lower layer of the source electrode 43, and a drain region 33 made of n$^+$ silicon is formed on the lower layer of the drain electrode 44. Then, a channel region (amorphous silicon film 46) made of amorphous silicon is formed on the lower layers of the source region 32 and the drain region 33.

The bottom-gated TFT 30 is formed through the steps described above.

By using the pattern forming method of this embodiment, the film thicknesses of the gate wiring 40 and the gate electrode 41 can be equal to each other, and the source wiring 42 and the source electrode 43 can be formed with the same film thickness. As a result, transistor characteristics are stabilized, and thereby the reliability of a pixel provided with this transistor is enhanced.

Figure 8D:
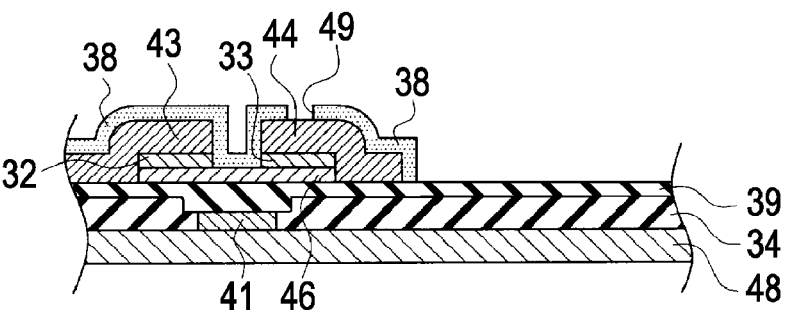

Next, as shown in FIG. 8D, a passivation film 38 (protective film) is formed as a film on the source electrode 43, the drain electrode 44, the source region 32, the drain region 33, and the exposed silicon layer by a vapor deposition method, a sputtering method, etc. Subsequently, the passivation film 38 on the gate insulating film 39 on which a pixel electrode 45 as will be described below is to be formed is removed by photolithographic treatment and etching treatment. At the same time, in order to electrically connect the pixel electrode 45 with the source electrode 43, a contact hole 49 is formed in the passivation film 38 on the drain electrode 44.

Figure 8E:
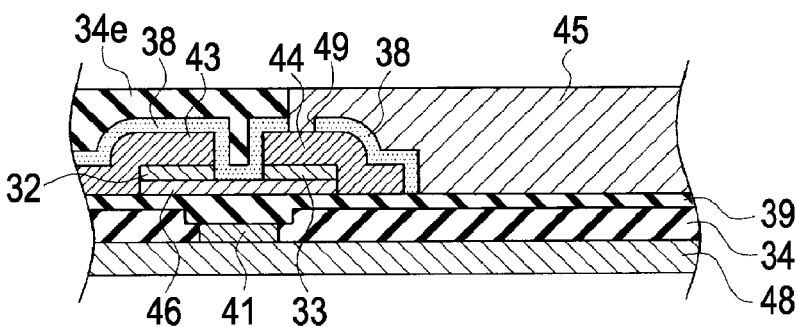

Next, as shown in FIG. 8E, a bank material is coated on a region including the gate insulating film 39 on which a pixel electrode 45 is to be formed. Here, the bank material contains materials, such as acrylic resin, polyimide resin, and polysilazane, as described above. Subsequently, the upper surface of this bank material (bank 34e for a pixel electrode) is subjected to lyophobic treatment by plasma treatment, etc. Next, the bank 34e for a pixel electrode which partitions off the region in which a pixel electrode 45 is to be formed is formed by photolithographic treatment.

Next, a pixel electrode 45 made of ITO (Indium Tin Oxide) is formed in the region partitioned off by the bank 34e for a pixel electrode by an ink jet method, a vapor deposition method, etc. Moreover, an electrical connection between the pixel electrode 45 and the drain electrode 44 is established by filling the pixel electrode 45 in the above-mentioned contact hole 49. In addition, in this embodiment, the upper surface of the bank 34e for a pixel electrode is subjected to lyophobic treatment, and the groove portion for a pixel electrode is subjected to lyophilic treatment. Therefore, the pixel electrode 45 can be formed without protruding from the groove portion for a pixel electrode.

As described above, the pixel of this embodiment shown in FIG. 7 can be formed.

In addition, in the embodiment, although the case in which gate wiring and a gate electrode are formed using the bank structure 1 has been described, the invention can be modified in various ways without being limited thereto. For example, in the embodiment, although one row of partition banks 34a are formed along the direction in which the first pattern formation region 55 extends, a plurality of rows of partition banks 34a may be formed. Therefore, even when the width H2 of the second pattern formation region 56 is sufficiently smaller than the width H1 of the first pattern formation region 55, this first pattern formation region 55 can be partitioned off into a plurality of regions to form a uniform film pattern between the first pattern formation region 55 and the second pattern formation region 56.

Figure 9A:
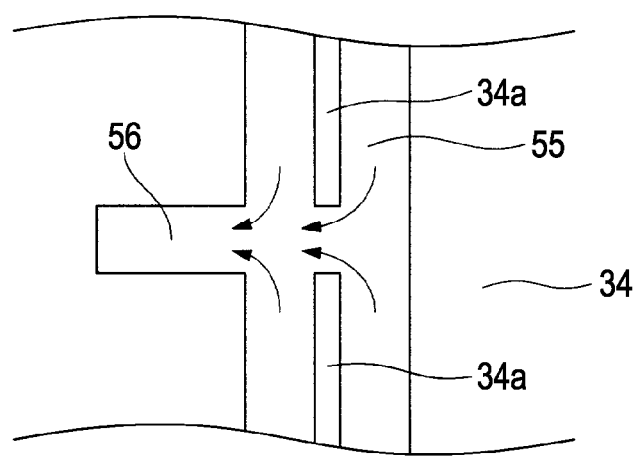
FIGS. 9A and 9B are sectional side views showing the steps of forming another bank structure.

Moreover, for example, in the bank structure 1, as shown in FIG. 9A, partition banks 34a may be formed in the first pattern formation region 55' such that they are symmetrical with respect to the second pattern formation region 56' which forms a fine wiring pattern. Thus, a functional liquid can be allowed to flow into the second pattern formation region 56' well when the functional liquid is discharged to the first pattern formation region 55.

Figure 9B:
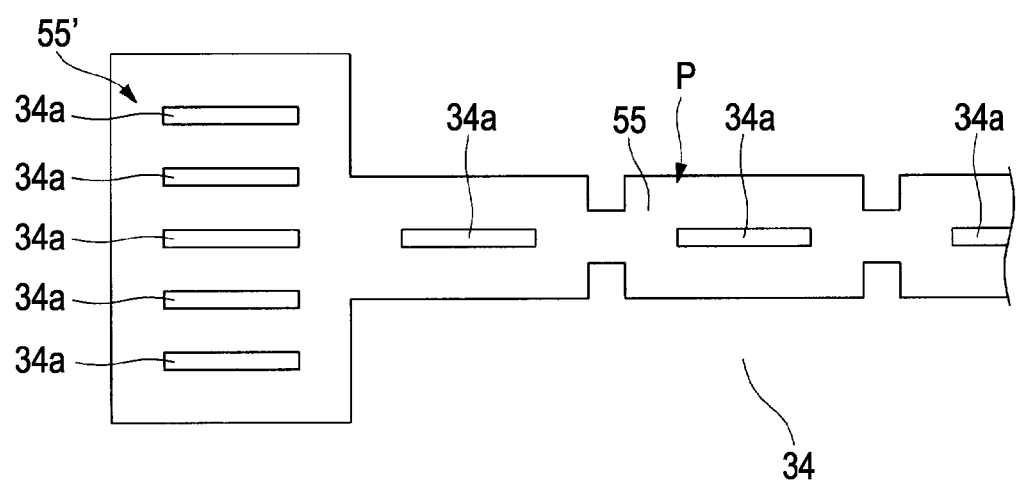

Moreover, for example, even when the invention has the wide pattern formation region 55' corresponding to a pad part of wiring, as shown in FIG. 9B, a uniform film pattern without a film thickness difference can be formed by providing the partition banks 34a in the pattern formation region 55'.

Electro-Optical Device

Next, a liquid crystal display device that is an example of the electro-optical device of the invention provided with the pixel (device) formed by the method of forming a film pattern which has the above bank structure will be described.

Figure 10:
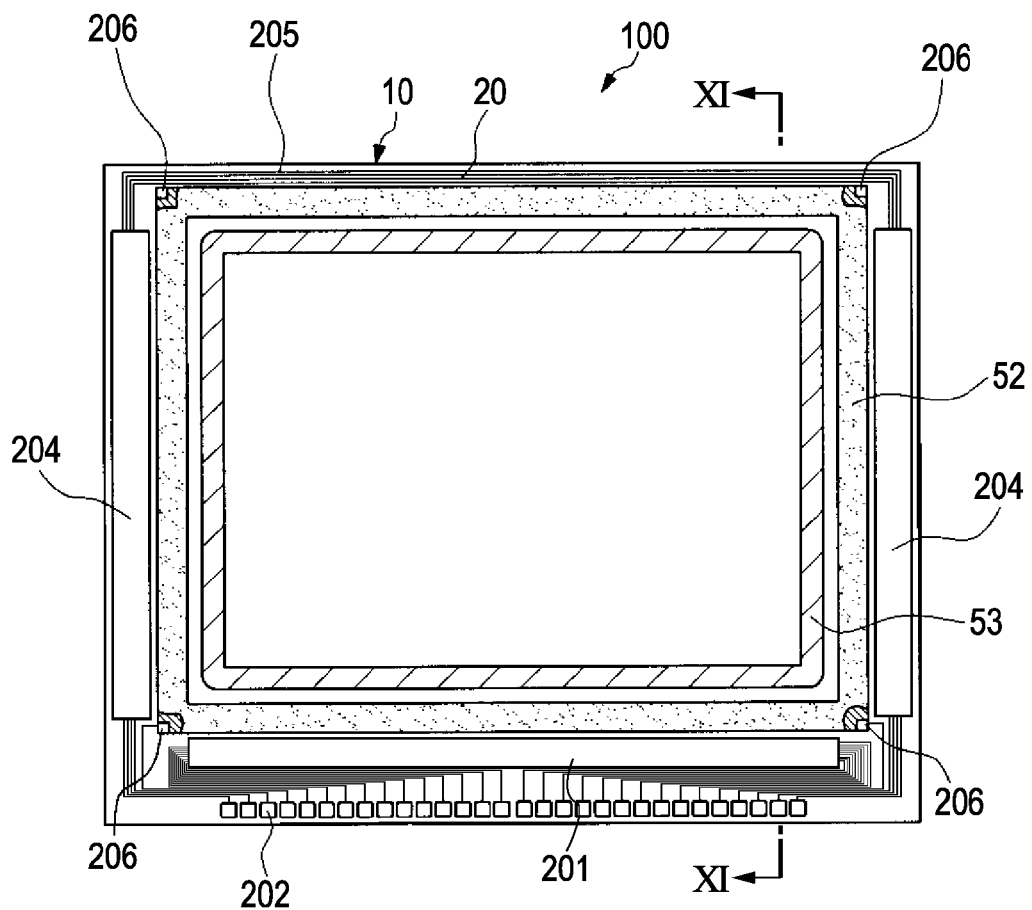
FIG. 10 is a plan view of a liquid crystal display device when it is viewed from the counter substrate side.
Figure 11:
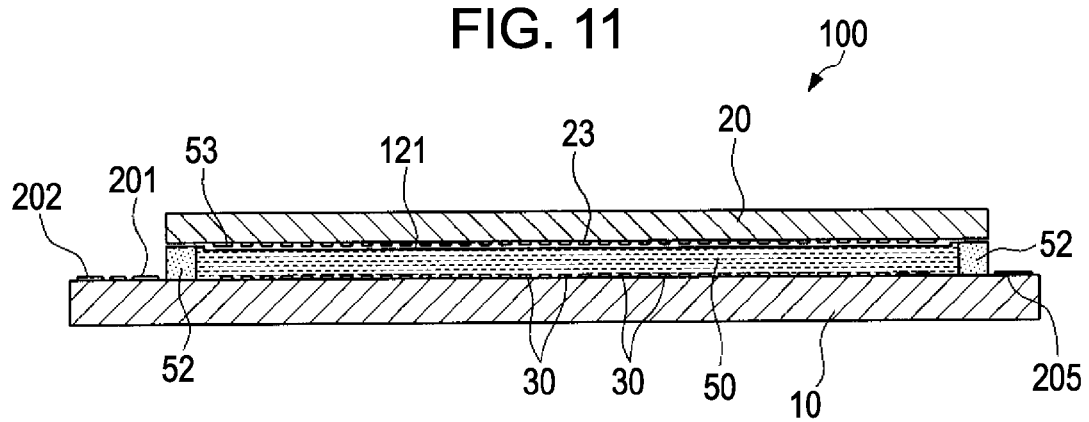
FIG. 11 is a sectional view of the liquid crystal display device taken along the line H-H' of FIG. 9.
Figure 12:
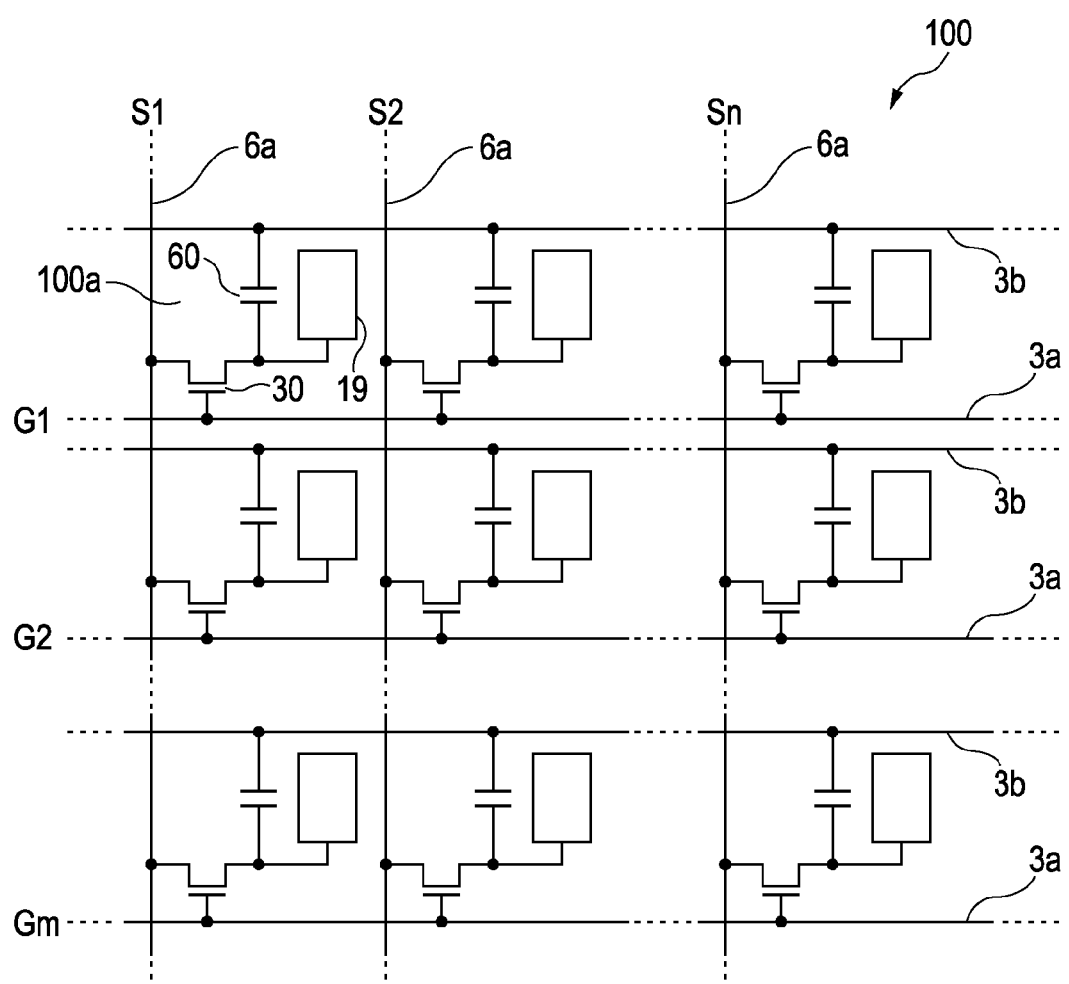
FIG. 12 is an equivalent circuit diagram of the liquid crystal display device.

FIG. 10 is a plan view of a liquid crystal display device according to the invention together with their respective components, as seen from the counter substrate side. FIG. 11 is a sectional view taken along the line H-H' of FIG. 10. FIG. 12 is an equivalent circuit diagram of various elements, wiring, etc. in a plurality of pixels formed in a matrix in an image display region of the liquid crystal display device. In the respective drawings used for following description, scales of respective layers and members are made different from each other so that the respective layers and members have recognizable sizes in the drawings.

In FIGS. 10 and 11, the liquid crystal display device (electro-optical device) 100 of this embodiment is configured such that a TFT array substrate 10 and a counter substrate 20, which make a pair, is bonded to each other by a sealant 52 that is a photo-curable sealing agent, and liquid crystal 50 is enclosed and held in a region which is partitioned off by this sealant 52.

A peripheral partition 53 made of a light-shielding material is formed in a region inside the region where the sealant 52 is formed. A data line driving circuit 201 and a mounting terminal 202 are formed in a region outside of the sealant 52 along one side of the TFT array substrate 10, and scanning line driving circuits 204 are formed along two sides adjacent to this one side. A plurality of wiring lines 205 for connecting the scanning line driving circuits 204 provided on both sides of the image display region with each other are formed in the remaining one side of the TFT array substrate 10. Moreover, an inter-substrate electrical connection material 206 for establishing electrical connection between the TFT array substrate 10 and the counter substrate 20 is disposed in at least one of the corners of the counter substrate 20. In addition, instead of forming the data line driving circuit 201 and the scanning line driving circuits 204 on the TFT array substrate 10, for example, a TAB (Tape Automated Bonding) substrate on which driving LSIs are mounted, and a terminal block formed at the periphery of the TFT array substrate 10 may be electrically and mechanically connected to each other through an anisotropic conductive film.

In addition, in a liquid crystal display device 100, a phase difference plate, a polarizing plate, and the like, are disposed in a predetermined direction according to the type of the liquid crystal 50 to be used, i.e., the kind of modes of operation such a TN (Twisted Nematic) mode, C-TN method, VA method, IPS method, or normal white mode/normal black mode; however, illustration thereof is omitted herein.

Moreover, in a case in which the liquid crystal display device 100 is configured for color display, for example, red (R), green (G), and blue (B) color filters along with a protective film are formed in regions where they face pixel electrodes (as will be described below), respectively, of the TFT array substrate 10 in the counter substrate 20.

In the image display region of the liquid crystal display device 100 which has such structure, as shown in FIG. 12, a plurality of pixels 100a are configured in a matrix. Each of these pixels 100a is formed with a pixel-switching TFT (switching element) 30. Data lines 6a which supply pixel signals S1, S2, . . . , and Sn, are electrically connected to the corresponding sources of the TFTs 30. The pixel signals S1, S2, . . . , and Sn to be written in the data lines 6a may be supplied sequentially in this order, may be supplied to a plurality of data lines which are adjacent to each other, or may be supplied to every group. Moreover, scanning lines 3a are electrically connected to the corresponding gates of the TFTs 30, and they are configured to sequentially apply scanning signals G1, G2, . . . , and Gm in this order to the scanning lines 3a in pulses with predetermined timing.

Pixel electrodes 19 are electrically connected to the corresponding drains of the TFTs 30 to write the pixel signals S1, S2, . . . , and Sn supplied from the data lines 6a in the respective pixels with predetermined timing by turning on the TFTs 30 which are switching elements during a certain period. Predetermined levels of the pixel signals S1 S2, . . . , and Sn written in the liquid crystal through the pixel electrodes 19 in this manner are held during a certain period between the TFT array substrate and a counter electrode 121 of the counter substrate 20 shown in FIG. 11. In addition, in order to prevent the held pixel signals S1, S2, . . . , and Sn from leaking, a storage capacitor 60 is added in parallel with a liquid crystal capacitor which is formed between each of the pixel electrodes 19 and the counter electrode 121. For example, the voltage of each pixel electrode 19 is held by the storage capacitor 60 during the time triple digits as longer as the time when a source voltage is applied. Thereby, the storage characteristics of charges are improved and thus the liquid crystal display device 100 with high contrast ratio can be realized.

Figure 13:
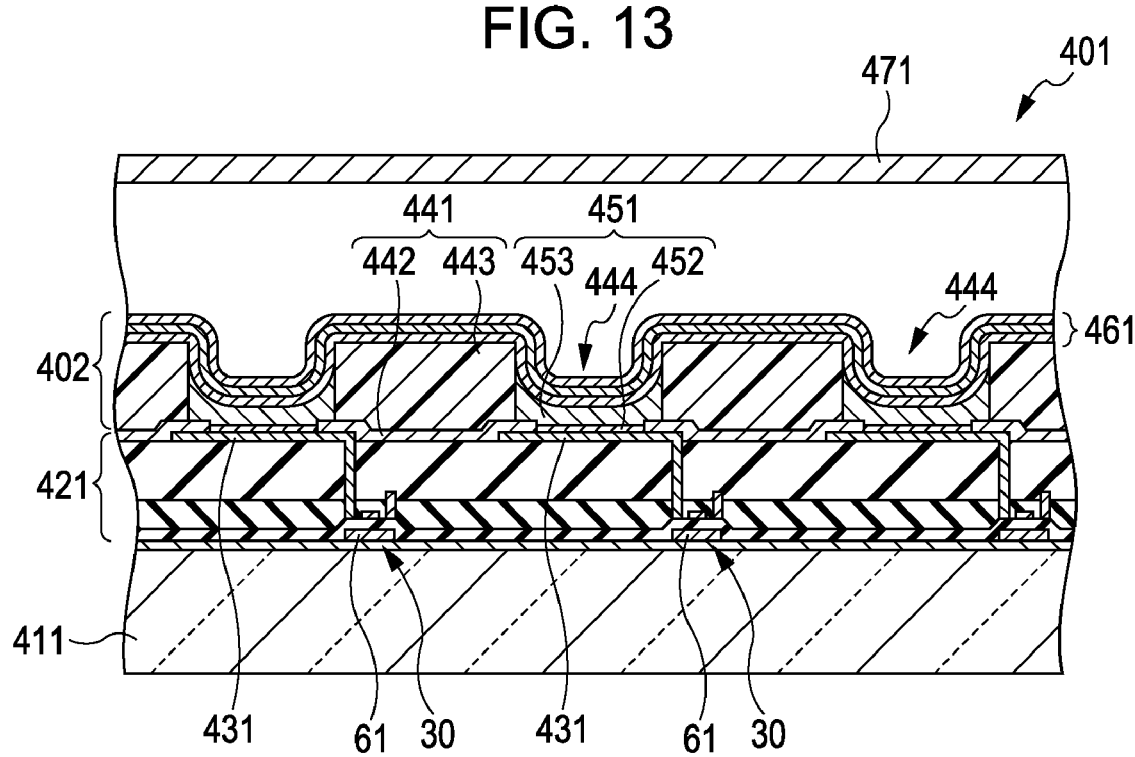
FIG. 13 is a partially enlarged sectional view of an organic EL device.

FIG. 13 is a sectional side view of an organic EL device provided with the pixels formed by the above bank structure and the pattern forming method. Hereinafter, the schematic configuration of the organic EL device will be described referring to FIG. 13.

In FIG. 13, the organic EL device 401 is configured such that wiring and driving ICs (not shown) of a flexible substrate (not shown) are connected to an organic EL element 402 including a substrate 411, a pixel element part 421, pixel electrodes 431, a bank part 441, a light-emitting element 451, a negative electrode 461 (counter electrode), and a sealing substrate 471. The pixel element part 421 is configured such that TFTs 30 that are active elements is formed on the substrate 411, and a plurality of pixel electrodes 431 are aligned on the pixel element part 421. Also, gate wiring 61 which constitutes each of the TFTs 30 is formed by the wiring pattern forming method of the above-described embodiment.

Between the respective pixel electrodes 431 is formed a bank part 441 in the shape of a grid, and the light-emitting element 451 is formed in a recessed opening 444 formed by the bank part 441. In addition, the light-emitting element 451 is composed of an element which emits light in red, an element which emits light in green, and an element which emits light in blue, and the organic EL device 401 implements a full color display by these elements. The negative electrode 461 is formed on the whole upper surfaces of the bank part 441 the light-emitting element 451, and the sealing substrate 471 is laminated on the negative electrode 461.

The manufacturing process of the organic EL device 401 including the organic EL element includes a bank part forming step of forming the bank part 441, a plasma treatment step of forming the light-emitting element 451 appropriately, a light-emitting element forming step of forming the light-emitting element 451, a counter electrode forming step of forming the negative electrode 461, and a sealing step of laminating and sealing the sealing substrate 471 on the negative electrode 461.

The light-emitting element forming step includes a hole injection layer forming step and a light-emitting layer forming step which form a hole injection layer 452 and a light-emitting layer 453 on the recessed opening 444, i.e., the pixel electrode 431, to form the light-emitting element 451. Also, the hole injection layer forming step has a first discharge step of discharging a liquid material for forming the hole injection layer 452 on each pixel electrode 431, and a first drying step of drying the discharged liquid material to form the hole injection layer 452. Moreover, the light-emitting layer forming step has a second discharge step of discharging a liquid material for forming the light-emitting layer 453 to the hole injection layer 452, and a second drying step of drying the discharged liquid material to form the light-emitting layer 453. In addition, three kinds of light-emitting layers 453 are formed of materials corresponding to three colors of red, green, and blue, as mentioned above. Accordingly, the second discharge step includes three steps in order to discharge the three kinds of materials, respectively.

In this light-emitting element forming step, the droplet discharge apparatus IJ can be used in the first discharge step in the hole injection layer forming step, and the second discharge step in the light-emitting layer forming step. Therefore, even in a case in which a film pattern is fine, a uniform film pattern can be obtained.

According to the electro-optical device of the invention, since it has a device with high-precision electrical properties, etc., the electro-optical device with improved quality and performance can be realized.

Moreover, the electro-optical device according to the invention can also be applied, in addition to the above-mentioned device, to a PDP (plasma display panel), a surface-conduction-type electron emission element, or the like which utilizes a phenomenon that electron emission is caused by applying an electric current to a thin film with a small area, which is formed on a substrate, in parallel to the surface of the film.

Electronic Apparatus

Next, a concrete example of the electronic apparatus of the invention will be described.

Figure 14:
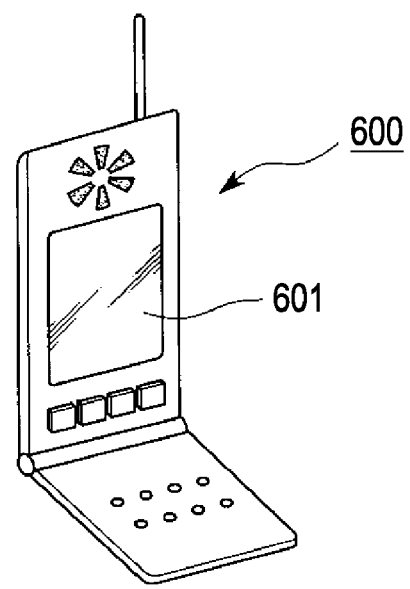
FIG. 14 is a view showing a concrete example of an electronic apparatus of the invention.

FIG. 14 is a perspective view showing an example of a portable telephone. In FIG. 14, reference numeral 600 denotes a body of the portable telephone and reference numeral 601 denotes a liquid crystal display section including the liquid crystal display device of the above embodiment.

Since the electronic apparatus shown in FIG. 14 includes the liquid crystal display device formed by the method of forming a film pattern having the bank structure of the above embodiment, it is possible to achieve high quality and performance.

In addition, although the electronic apparatus of this embodiment is an electronic apparatus including a liquid crystal device, it can also be an electronic apparatus including other types of electro-optical devices, such as an organic electroluminescent display device or a plasma display device.

In addition, the electro-optical device of the invention can also be applied to various electronic apparatuses in addition to the above-mentioned electronic apparatuses. For example, the electro-optical device of the invention can be applied to electronic apparatuses, such as liquid crystal projectors, personal computers (PC) corresponding to multimedia, engineering workstations (EWS), pagers, word processors, television sets, view-finder-type or monitor-direct-viewing-type video tape recorders, electronic notebooks, electronic calculators, car navigation systems, POS (Point of Sale) terminals, and apparatuses including a touch panel.

Although the preferred embodiments of the invention have been described with reference to the accompanying drawings, it should be understood that the invention is not limited to such embodiments. Various shapes or combinations of respective components illustrated in the above-described embodiments are merely examples, and various changes may be made depending on design requirements or the like without departing from the spirit or scope of the invention.

For example, in the above embodiment, a desired bank structure (for example, first pattern formation region, etc.) is formed by photolithographic treatment and etching treatment. On the other hand, desired groove portions may be formed by patterning into banks using a laser instead of the above forming method.

What is claimed is:

1. A bank structure that partitions a pattern formation region in which a functional liquid is to be disposed and flow, the bank structure comprising:

primary banks that define, when viewed in plan, a first pattern formation region and a second pattern formation region that is in communication with the first pattern formation region such that the functional liquid may flow therebetween, the second pattern formation region having a larger width than the first pattern formation region; and at least one secondary bank disposed entirely within the second pattern formation region, the at least one secondary bank being spaced apart from the primary banks and having a length and height that are less than a length and height of the primary banks, wherein the secondary bank regulates a flow direction of the functional liquid, and a partition width defined by a distance between the primary banks and the at least one secondary bank substantially orthogonal to the flow direction of the functional liquid that is regulated by the at least one secondary bank is less than ±20% of the width of the first pattern formation region.

2. The bank structure of claim 1, wherein the first pattern formation region extends perpendicularly to the second pattern formation region.

3. The bank structure of claim 1, wherein the secondary bank is arranged in parallel with an orienation of the second pattern formation region.

4. The bank structure of claim 1, wherein the at least one secondary bank further comprises a plurality of secondary banks arranged entirely within the second pattern formation region, each of the secondary banks being spaced apart from the primary banks and having a length and height that are less than a length and height of the primary banks.

* * * * *